United States Patent
Okawara

(10) Patent No.: US 12,189,288 B2
(45) Date of Patent: Jan. 7, 2025

(54) COMPOSITION AND FILM FORMING METHOD

(71) Applicant: FUJIFILM Corporation, Tokyo (JP)

(72) Inventor: Takahiro Okawara, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 683 days.

(21) Appl. No.: 17/320,325

(22) Filed: May 14, 2021

(65) Prior Publication Data

US 2021/0269619 A1   Sep. 2, 2021

Related U.S. Application Data

(63) Continuation of application No. PCT/JP2019/046523, filed on Nov. 28, 2019.

(30) Foreign Application Priority Data

Dec. 5, 2018  (JP) ................ 2018-228070
Mar. 7, 2019  (JP) ................ 2019-041113

(51) Int. Cl.
| G03F 7/027 | (2006.01) |
| C08K 3/36 | (2006.01) |
| C08K 7/18 | (2006.01) |
| C09D 7/40 | (2018.01) |
| C09D 7/65 | (2018.01) |
| C09D 183/02 | (2006.01) |
| G03F 7/004 | (2006.01) |
| G03F 7/028 | (2006.01) |
| G03F 7/075 | (2006.01) |
| C01B 33/14 | (2006.01) |

(52) U.S. Cl.
CPC .............. *G03F 7/027* (2013.01); *C08K 3/36* (2013.01); *C08K 7/18* (2013.01); *C09D 7/67* (2018.01); *C09D 7/68* (2018.01); *C09D 183/02* (2013.01); *G03F 7/0048* (2013.01); *G03F 7/028* (2013.01); *G03F 7/0757* (2013.01); *C01B 33/14* (2013.01)

(58) Field of Classification Search
CPC ........ G03F 7/027; G03F 7/028; G03F 7/0755; G03F 7/0757; G03F 7/0048; C09D 7/67; C09D 7/68; C09D 183/02
See application file for complete search history.

(56) References Cited

U.S. PATENT DOCUMENTS

2008/0241744 A1 * 10/2008 Kanchiku ............ B41C 1/1008
                                                          430/281.1
2013/0158148 A1   6/2013  Tsugane et al.
2014/0154628 A1 * 6/2014  Nagoshi ............... H05K 3/287
                                                          430/280.1
2016/0130152 A1   5/2016  Yoshitake et al.
2017/0015561 A1   1/2017  Masuyama et al.
2017/0183503 A1   6/2017  Otani et al.
2019/0212648 A1   7/2019  Kawashima et al.
2019/0221596 A1   7/2019  Oota et al.
2020/0148888 A1   5/2020  Okawara et al.

FOREIGN PATENT DOCUMENTS

| CN | 103068884 A | 4/2013 | |
| CN | 105283413 A | 1/2016 | |
| CN | 105939966 A | 9/2016 | |
| CN | 107076879 A | 8/2017 | |
| CN | 108602672 A | 9/2018 | |
| CN | 109790390 A | 5/2019 | |
| EP | 1 101 803 A1 | 5/2001 | |
| JP | 2004083846 A * | 3/2004 | |
| JP | 2016-135838 A | 7/2016 | |
| TW | 201525621 A | 7/2015 | |
| TW | 201609540 A | 3/2016 | |
| TW | 201821253 A | 6/2018 | |
| WO | WO 99/63011 A1 | 12/1999 | |
| WO | WO-2010150677 A1 * | 12/2010 | ............ B82Y 30/00 |
| WO | WO 2015/098812 A1 | 7/2015 | |
| WO | WO-2015122395 A1 * | 8/2015 | ............... C08F 2/44 |
| WO | WO-2015190374 A1 * | 12/2015 | ............ G02B 1/111 |
| WO | WO 2018/061891 A1 | 4/2018 | |
| WO | WO 2018/062130 A1 | 4/2018 | |
| WO | WO 2019/017280 A1 | 1/2019 | |
| WO | WO 2019/098812 A1 | 5/2019 | |

OTHER PUBLICATIONS

Korean Office Action for corresponding Korean Application No. 10-2021-7015284, dated Jun. 5, 2023, with an English translation.
International Preliminary Report on Patentability and Written Opinion of the International Searching Authority (Forms PCT/IB/326, PCT/IB/373 and PCT/ISA/237) for corresponding International Application No. PCT/JP2019/046523, dated Jun. 17, 2021, with English translation.
International Search Report (Form PCT/ISA/210) for corresponding International Application No. PCT/JP2019/046523, dated Feb. 18, 2020, with English translation.
Chinese Office Action and Search Report for corresponding Chinese Application No. 201980078801.0, dated Mar. 13, 2023, with a partial English translation.

(Continued)

*Primary Examiner* — John S Chu
(74) *Attorney, Agent, or Firm* — Birch, Stewart, Kolasch & Birch, LLP

(57) ABSTRACT

Provided is a composition including colloidal silica particles; and a solvent, in which a viscosity at 25° C. is 4 mPa·s or lower. The colloidal silica particles are a composition in which a plurality of spherical silica particles are linked in a beaded shape or a composition in which a plurality of spherical silica particles are linked in a planar shape. The solvent includes a solvent A1 having a boiling point of 190° C. to 280° C. Provided is also a film forming method using the above-described composition.

17 Claims, 1 Drawing Sheet

(56) References Cited

OTHER PUBLICATIONS

Taiwanese Office Action and Search Report for corresponding Taiwanese Application No. 108144181, dated Jul. 6, 2023, with partial English translation.
Chinese Office Action for corresponding Chinese Application No. 201980078801.0, dated Sep. 19, 2023, with English translation.
Japanese Notice of Reasons for Refusal for corresponding Japanese Application No. 2020-559112, dated May 10, 2022, with an English translation.

* cited by examiner

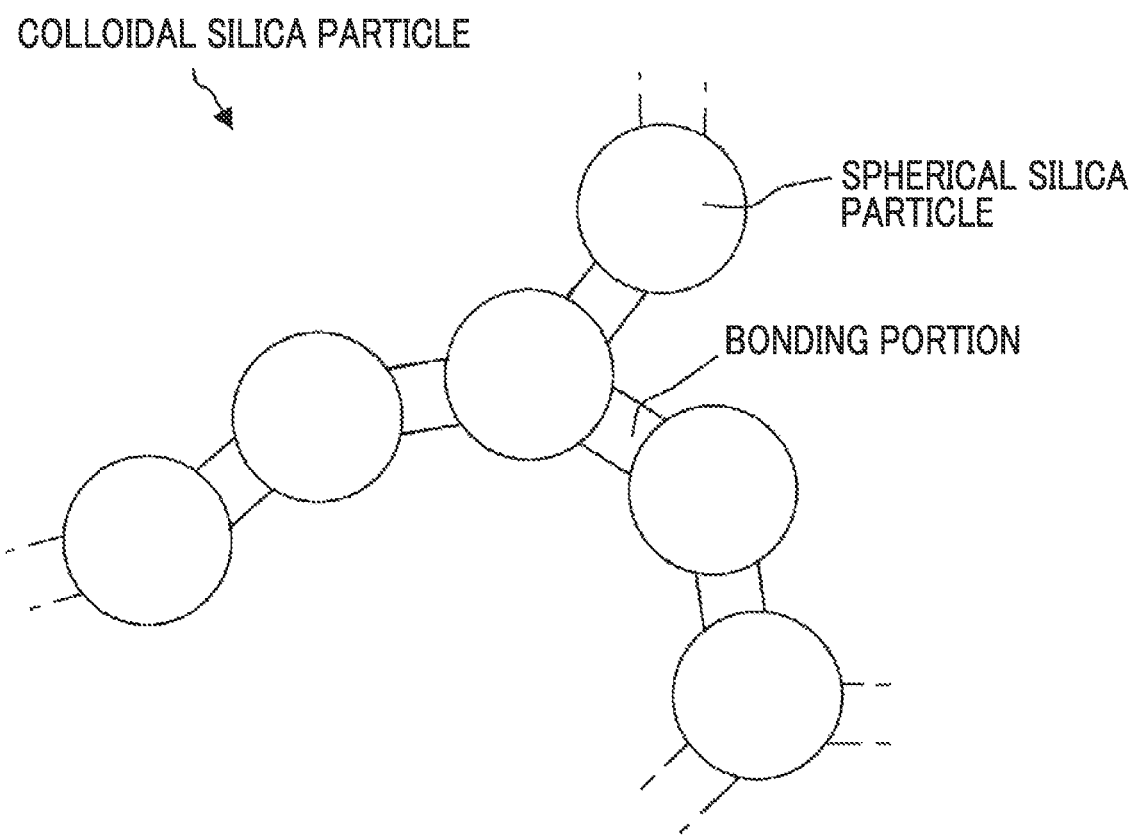

COMPOSITION AND FILM FORMING METHOD

CROSS-REFERENCE TO RELATED APPLICATIONS

This application is a Continuation of PCT International Application No. PCT/JP2019/046523 filed on Nov. 28, 2019, which claims priority under 35 U.S.C § 119(a) to Japanese Patent Application No. 2018-228070 filed on Dec. 5, 2018, and Japanese Patent Application No. 2019-041113 filed on Mar. 7, 2019. Each of the above application(s) is hereby expressly incorporated by reference, in its entirety, into the present application.

BACKGROUND OF THE INVENTION

1. Field of the Invention

The present invention relates to a composition including colloidal silica particles and a film forming method using the above-described composition.

2. Description of the Related Art

For example, an optical functional layer such as a low refractive index film is applied to a surface of a transparent substrate in order to prevent reflection of light to be incident. The application field of the optical functional layer is wide, and the optical functional layer is applied to products in various fields such as optical devices, construction materials, observation instruments, or window glass. As the material of the optical functional layer, various materials including not only organic materials but also inorganic materials are used and are targets to be developed. In particular, recently, the development of materials to be applied to the optical devices has progressed. Specifically, the search of materials having physical properties or workability suitable for a display panel, an optical lens, or an image sensor has progressed.

An optical functional layer that is applied to a precision optical device such as an image sensor is required to have fine and accurate processing formability. Therefore, in the related art, a gas phase method such as a vacuum deposition method or a sputtering method that is suitable for microfabrication has been adopted. As a material used in the gas phase method, for example, a single-layer film formed of $MgF_2$ or cryolite has been put into practice. In addition, the application of a metal oxide such as $SiO_2$, $TiO_2$, or $ZrO_2$ has also been attempted.

On the other hand, in the gas phase method such as a vacuum deposition method or a sputtering method, the device and the like are expensive, and thus the manufacturing costs may be high. Accordingly, recently, the manufacturing of the optical functional layer such as a low refractive index film using a composition including silica particles has been investigated (refer to WO2015/190374A and JP2016-135838A). In the techniques described in WO2015/190374A and JP2016-135838A, a film having a low refractive index can be manufactured.

SUMMARY OF THE INVENTION

The present inventor conducted a further investigation on the composition including silica particles and found that, in a case where the composition is applied and dried, the silica particles are likely to aggregate such that defects such as unevenness are likely to occur on the obtained film surface. This way, there is room for further improvement for the use of the composition including silica particles.

Accordingly, an object of the present invention is to provide a composition with which a film having reduced defects can be formed, and a film forming method.

According to the investigation, the present inventors found that the object can be achieved using a composition described below, thereby completing the present invention. Accordingly, the present invention provides the following.

<1> A composition comprising:
colloidal silica particles; and
a solvent,
in which in the colloidal silica particles, a plurality of spherical silica particles are linked in a beaded shape,
in which the solvent includes a solvent A1 having a boiling point of 190° C. to 280° C., and
a viscosity of the composition at 25° C. is 4 mPa·s or lower.

<2> A composition comprising:
colloidal silica particles; and
a solvent,
in which in the colloidal silica particles, a plurality of spherical silica particles are linked in a planar shape, and
in which the solvent includes a solvent A1 having a boiling point of 190° C. to 280° C., and
a viscosity of the composition at 25° C. is 4 mPa·s or lower.

<3> The composition according to <1> or <2>,
in which the solvent A1 is a non-protonic solvent.

<4> The composition according to any one of <1> to <3>,
in which the solvent A1 includes at least one selected from alkylenediol diacetate or cyclic carbonate.

<5> The composition according to any one of <1> to <4>,
in which the solvent includes 3 mass % or higher of the solvent A1.

<6> The composition according to any one of <1> to <5>,
in which the solvent further includes a solvent A2 having a boiling point of 110° C. or higher and lower than 190° C.

<7> The composition according to <6>,
wherein the solvent A2 includes at least one selected from an ether solvent or an ester solvent.

<8> The composition according to <6> or <7>,
in which a content of the solvent A2 is 500 to 5000 parts by mass with respect to 100 parts by mass of the solvent A1.

<9> The composition according to any one of <1> to <8>,
in which the solvent further includes at least one solvent A3 selected from methanol, ethanol, or 2-propyl alcohol.

<10> The composition according to any one of <1> to <9>,
in which a content of a compound having a molecular weight of higher than 300 in the solvent is 10 mass % or lower.

<11> The composition according to any one of <1> to <10>,
in which a content of a compound having a viscosity of higher than 10 mPa·s at 25° C. in the solvent is 10 mass % or lower.

<12> The composition according to any one of <1> to <11>,
in which a concentration of solid contents of the composition is 5 mass % or higher.

<13> The composition according to any one of <1> to <12>,
in which a content of the colloidal silica particles in the composition is 5 mass % or higher.
<14> The composition according to any one of <1> to <13>,
in which an absolute value of a zeta potential of the composition is 25 mV or higher.
<15> The composition according to any one of <1> to <14>, further comprising:
a photopolymerization initiator; and
a polymerizable compound.
<16> The composition according to any one of <1> to <15>, which is used for forming a pattern using a photolithography method.
<17> The composition according to any one of <1> to <16>,
in which in a case where the composition is applied to a glass substrate and is heated at 200° C. for 5 minutes to form a film having a thickness of 0.5 μm, a contact angle of the film with water at 25° C. is 300 or more.
<18> A film forming method comprising using the composition according to any one of <1> to <17>.

The present invention can provide a composition with which a film having reduced defects can be formed, and a film forming method.

BRIEF DESCRIPTION OF THE DRAWINGS

FIG. 1 is an enlarged view schematically illustrating a shape of colloidal silica particles.

DESCRIPTION OF THE PREFERRED EMBODIMENTS

Hereinafter, the details of the present invention will be described.

In the present specification, numerical ranges represented by "to" include numerical values before and after "to" as lower limit values and upper limit values.

In the present specification, unless specified as a substituted group or as an unsubstituted group, a group (atomic group) denotes not only a group (atomic group) having no substituent but also a group (atomic group) having a substituent. For example, "alkyl group" denotes not only an alkyl group having no substituent (unsubstituted alkyl group) but also an alkyl group having a substituent (substituted alkyl group).

In the present specification, unless specified otherwise, "exposure" denotes not only exposure using light but also drawing using a corpuscular beam such as an electron beam or an ion beam. Examples of the light used for exposure include an actinic ray or radiation, for example, a bright light spectrum of a mercury lamp, a far ultraviolet ray represented by excimer laser, an extreme ultraviolet ray (EUV ray), an X-ray, or an electron beam.

In the present specification, "(meth)acrylate" denotes either or both of acrylate and methacrylate, "(meth)acryl" denotes either or both of acryl and methacryl, and "(meth)acryloyl" denotes either or both of acryloyl and methacryloyl.

In the present specification, a weight-average molecular weight and a number-average molecular weight are defined as values in terms of standard polystyrene measured by gel permeation chromatography (GPC). As a measuring device and measurement conditions, the following condition 1 is basically used, and the following condition 2 is allowed depending on the solubility of a sample or the like. In this case, depending on the kind of a polymer, a more appropriate carrier (eluent) and a column suitable for the carrier may be selected and used. Other features can be found in JIS K 7252-1 to 4:2008.

(Condition 1)
Column: a column in which TOSOH TSK gel Super HZM-H, TOSOH TSK gel Super HZ4000, and TOSOH TSK gel Super HZ2000 are linked to each other
Carrier: tetrahydrofuran
Measurement temperature: 40° C.
Carrier flow rate: 1.0 ml/min
Sample concentration: 0.1 mass %
Detector: refractive index (RI) detector
Injection volume: 0.1 ml (Condition 2)
Column: a column in which two TOSOH TSK gel Super AWM-H's are linked
Carrier: 10 mM LiBr/N-methylpyrrolidone
Measurement temperature: 40° C.
Carrier flow rate: 1.0 ml/min
Sample concentration: 0.1 mass %
Detector: refractive index (RI) detector
Injection volume: 0.1 ml <Composition>

A composition according to an embodiment of the present invention comprises;
colloidal silica particles; and
a solvent,
in which the solvent includes a solvent A1 having a boiling point of 190° C. to 280° C., and
a viscosity of the composition at 25° C. is 4 mPa·s or lower.

In addition, in a first aspect of the composition according to the embodiment of the present invention, in the colloidal silica particles, a plurality of spherical silica particles are linked in a beaded shape.

In addition, in a second aspect of the composition according to the embodiment of the present invention, in the colloidal silica particles, a plurality of spherical silica particles are linked in a planar shape.

The composition according to the embodiment of the present invention includes a solvent A1 having a boiling point of 190° C. to 280° C. Therefore, it is presumed that the drying rate of the composition can be appropriately adjusted and aggregation of the colloidal silica particles during film formation can be suppressed. The viscosity of the composition is 4 mPa·s or lower. Therefore, it is presumed that the solvent is likely to enter gaps between spherical silica particles forming the colloidal silica particles. As a result, it is presumed that aggregation of the colloidal silica particles during film formation can be more effectively suppressed. Therefore, with the composition according to the embodiment of the present invention, a film having reduced defects can be formed. In addition, the composition according to the embodiment of the present invention includes the above-described colloidal silica particles such that the void volume of the obtained film increases and a film having a low refractive index can be formed.

The viscosity of the composition according to the embodiment of the present invention at 25° C. is preferably 3.6 mPa·s or lower, more preferably 3.4 mPa·s or lower, and still more preferably 3.2 mPa·s or lower. The lower limit is preferably 1.0 mPa·s or higher, more preferably 1.4 mPa·s or higher, and still more preferably 1.8 mPa·s or higher. In a case where the viscosity of the composition is in the above-described range, the effect of the present invention can be easily obtained more significantly, and the occurrence of defects can be more effectively suppressed. Further, the application properties of the composition are improved such that a film having an excellent surface shape can be easily obtained. Hereinafter, unless specified otherwise, the value of the viscosity is a value at 25° C.

In the present invention, the concentration of solid contents is preferably 5 mass % or higher, more preferably 7 mass % or higher, and still more preferably 8 mass % or higher. The upper limit is preferably 15 mass % or lower, more preferably 12 mass % or lower, and still more preferably 10 mass % or lower. In a case where the concentration of solid contents of the present invention is in the above-described range, the effect of the present invention can be easily obtained more significantly, and the occurrence of defects can be more effectively suppressed.

Hereinafter, each component of the composition according to the embodiment of the present invention will be described.

«Colloidal Silica Particles»

The composition according to the embodiment of the present invention includes colloidal silica particles. Examples of the colloidal silica particles used in the present invention include the following first and second aspects.

First aspect: an aspect in which a plurality of spherical silica particles are linked in a beaded shape Second aspect: an aspect in which a plurality of spherical silica particles are linked in a planar shape In addition, the colloidal silica particles according to the first aspect may further satisfy the requirements of the colloidal silica particles according to the second aspect.

In the present specification, "spherical" only has to be substantially spherical and may be deformed within a range where the effect of the present invention can be exhibited. For example, "spherical" refers to not only a shape having unevenness on a surface but also a flat shape having a major axis in a predetermined direction.

In addition, "a plurality of spherical silica particles are linked in a beaded shape" refers to a structure in which a plurality of spherical silica particles are linked in a linear and/or branched shape. For example, a structure in which a plurality of spherical silica particles are linked through bonding portions having a smaller outer diameter than the spherical silica particles as illustrated in FIG. 1 can be used. In addition, in the present invention, the structure in which "a plurality of spherical silica particles are linked in a beaded shape" refers to not only a structure in which a plurality of spherical silica particles are linked in a ring shape but also a plurality of spherical silica particles are linked in a chain-like shape having a terminal.

In addition, "a plurality of spherical silica particles are linked in a planar shape" refers to a structure in which a plurality of spherical silica particles are linked on substantially the same plane. "Substantially the same plane" refers to not only the same plane but also a case where the silica particles are vertically shifted from the same plane. For example, the silica particles may be vertically shifted in a range where the particle size of the silica particles is 50% or lower.

In the colloidal silica particles used in the present invention, it is preferable that the ratio $D_1/D_2$ of the average particle size $D_1$ that is measured using a dynamic light scattering method to the average particle size $D_2$ that is obtained by the following Expression (1) is 3 or higher. The upper limit of the $D_1/D_2$ is not particularly limited and is preferably 1000 or lower, more preferably 800 or lower, and still more preferably 500 or lower. By adjusting $D_1/D_2$ to be in the above-described range, excellent optical characteristics can be exhibited, and further aggregation during drying can be effectively suppressed. The value of $D_1/D_2$ in the colloidal silica particles is also an index indicating the degree to which the spherical silica particles are linked.

$$D_2=2720/S \qquad (1),$$

where $D_2$ represents an average particle size with a unit of nm and S represents a specific surface area of colloidal silica particles measured using a nitrogen adsorption method with a unit of $m^2/g$.

The average particle size $D_2$ of the colloidal silica particles can be considered as an average particle size similar to that of primary particles of the spherical silica. The average particle size $D_2$ is preferably 1 nm or more, more preferably 3 nm or more, still more preferably 5 nm or more, and still more preferably 7 nm or more. The upper limit is preferably 100 nm or less, more preferably 80 nm or less, still more preferably 70 nm or less, still more preferably 60 nm or less, and still more preferably 50 nm or less.

The average particle size $D_2$ can be replaced with a circle equivalent diameter (D0) of a projection image of a spherical portion measured using a transmission electron microscope (TEM). The average particle size as the circle equivalent diameter is evaluated as a number average value of 50 or more particles unless specified otherwise.

The average particle size $D_1$ of the colloidal silica particles can be considered as number average particle size of secondary particles obtained by aggregation of the plurality of spherical silica particles. Accordingly, typically, a relationship of $D_1>D_2$ is satisfied. The average particle size $D_1$ is preferably 25 nm or more, more preferably 30 nm or more, and still more preferably 35 nm or more. The upper limit is preferably 1000 nm or less, more preferably 700 nm or less, still more preferably 500 nm or less, and still more preferably 300 nm or less.

Unless specified otherwise, the average particle size $D_1$ of the colloidal silica particles is measured using a dynamic light scattering particle size distribution analyzer (manufactured by Nikkiso Co., Ltd., Nanotrac Wave-EX150 (trade name)). The procedure is as follows. 20 ml of a dispersion liquid of colloidal silica particles is collected in a sample bottle and is diluted with toluene such that the concentration of solid contents is 0.2 mass %. The diluted sample solution is used for the test immediately after being irradiated with ultrasonic waves of 40 kHz for 1 minute. Data is obtained 10 times using a 2 ml quartz cell for measurement at a temperature of 25° C., and the obtained "number average" is obtained as the average particle size. Other detailed conditions and the like can be found in JIS Z8828: 2013 "Particle Size Analysis-Dynamic Light Scattering" as necessary. For each level, five samples are prepared and the average value thereof is adopted.

In the present invention, it is preferable that in the colloidal silica particles, a plurality of spherical silica particles having an average particle size of 1 to 80 nm are linked through a linking material. The upper limit of the average particle size of the spherical silica particles is preferably 70 nm or less, more preferably 60 nm or less, and still more preferably 50 nm or less. In addition, the lower limit of the average particle size of the spherical silica particles is preferably 3 nm or more, more preferably 5 nm or more, and still more preferably 7 nm or more. As the value of the spherical silica particles in the present invention, an average particle size that is obtained from a circle equivalent diameter of a projection image of a spherical portion measured using a transmission electron microscope (TEM) is used.

Examples of the linking material through which the spherical silica particles are linked include a metal oxide-containing silica. Examples of the metal oxide include an oxide of a metal selected from Ca, Mg, Sr, Ba, Zn, Sn, Pb, Ni, Co, Fe, Al, In, Y, or Ti. Examples of the metal oxide-containing silica include a reactant and a mixture of the metal oxide and silica ($SiO_2$). The details of the linking material can be found in WO2000/015552A, the content of which is incorporated herein by reference.

The number of spherical silica particles linked in the colloidal silica particles is preferably 3 or more and more preferably 5 or more. The upper limit is preferably 1000 or less, more preferably 800 or less, and still more preferably 500 or less. The number of spherical silica particles linked can be measured using a TEM.

In the composition according to the embodiment of the present invention, the colloidal silica particle may be used in the form of a particle solution (sol). For example, a silica sol described in JP4328935B can be used. Examples of a medium in which the colloidal silica particles are dispersed include an alcohol (for example, methanol, ethanol, or isopropanol), ethylene glycol, a glycol ether (for example, propylene glycol monomethyl ether), and a glycol ether acetate (for example, propylene glycol monomethyl ether acetate). In addition, a solvent A1, a solvent A2, and the like described below can also be used. The $SiO_2$ concentration in the particle solution (sol) is preferably 5 to 40 mass %.

As the particle solution (sol), a commercially available product can also be used. Examples of the commercially available product include. "SNOWTEX OUP", "SNOWTEX UP", "IPA-ST-UP", "SNOWTEX PS-M", "SNOWTEX PS-MO", "SNOWTEX PS-S", and "SNOWTEX PS-SO" manufactured by Nissan Chemical Industries Ltd., "FINE CATALOID F-120" manufactured by JGC C&C; and "QUARTRON PL" manufactured by Fuso Chemical Co., Ltd.

The content of the colloidal silica particles in the composition according to the embodiment of the present invention is preferably 5 mass % or higher, more preferably 7 mass % or higher, and still more preferably 9 mass % or higher. The upper limit is preferably 15 mass % or lower, more preferably 13 mass % or lower, and still more preferably 11 mass % or lower.

In addition, the content of the colloidal silica particles with respect to the total solid content of the composition according to the embodiment of the present invention is preferably 60 mass % or higher, more preferably 70 mass % or higher, still more preferably 80 mass % or higher, still more preferably 90 mass % or higher, still more preferably 95 mass % or higher, still more preferably 97 mass % or higher, and most preferably 99 mass % or higher. The upper limit may be 100 mass %, 99.99 mass % or lower, 99.95 mass % or lower, or 99.9 mass % or lower. In a case where the content of the colloidal silica particles is in the above-described range, a film having a high antireflection effect at a low refractive index and reduced defects can be easily obtained. In addition, in a case where a pattern is not formed or in a case where a pattern is formed using an etching method, the content of the colloidal silica particles with respect to the total solid content of the composition according to the embodiment of the present invention is preferably high and is, for example, preferably 95 mass % or higher, more preferably 97 mass % or higher, and still more preferably 99 mass % or higher. The upper limit may be 100 mass %, 99.99 mass % or lower, 99.95 mass % or lower, or 99.9 mass % or lower.

«Alkoxysilane Hydrolysate»

It is preferable that the composition according to the embodiment of the present invention includes at least one component (referred to as "alkoxysilane hydrolysate") selected from the group consisting of alkoxysilane and a hydrolysate of alkoxysilane. The composition according to the embodiment of the present invention includes the alkoxysilane hydrolysate such that the colloidal silica particles can be strongly bonded to each other during film formation and an effect of increasing the void volume in the film during film formation can be exhibited. In addition, by using the alkoxysilane hydrolysate, the wettability of the film surface can be improved. It is preferable that the alkoxysilane hydrolysate is produced by condensation due to hydrolysis of the alkoxysilane compound (A), and it is more preferable that the alkoxysilane hydrolysate is produced by condensation due to hydrolysis of the alkoxysilane compound and a fluoroalkyl group-containing alkoxysilane compound (B). Examples of the alkoxysilane hydrolysate include an alkoxysilane hydrolysate described in paragraphs "0022" to "0027" of WO2015/190374A, the content of which is incorporated herein by reference. In a case where the composition according to the embodiment of the present invention includes the alkoxysilane hydrolysate, the total content of the colloidal silica particles and the alkoxysilane hydrolysate is preferably 0.1 mass % or higher, more preferably 1 mass % or higher, and still more preferably 2 mass % or higher with respect to the total solid content in the composition. The upper limit is preferably 99.99 mass % or lower, more preferably 99.95 mass % or lower, and still more preferably 99.9 mass % or lower.

«Other Silica Particles»

The composition according to the embodiment of the present invention may further include silica particles (hereinafter, other silica particles) other than the colloidal silica particles according to any one of the first and second aspects. Examples of the other silica particles include hollow silica particles, solid silica particles, porous silica particles, and a cage type siloxane polymer. Examples of a commercially available product of the hollow silica particles include THRULYA 4110 (manufactured by JGC C&C). Examples of a commercially available product of the solid silica particles include PL-2L-IPA (manufactured by Fuso Chemical Co., Ltd.).

In a case where the composition according to the embodiment of the present invention includes the other silica particles, the content of the other silica particles is preferably 0.1 to 30 mass % with respect to the total solid content of the composition. The upper limit is preferably 20 mass % or lower, more preferably 10 mass % or lower, and still more preferably 5 mass % or lower. The lower limit is preferably 0.3 mass % or higher, more preferably 0.5 mass % or higher, and still more preferably 1 mass % or higher.

In addition, it is also preferable that the composition according to the embodiment of the present invention does not substantially include the other silica particles. According to this aspect, the occurrence of defects can be more effectively suppressed. A case where the composition according to the embodiment of the present invention does not substantially include the other silica particles represents that the content of the other silica particles is 0.05 mass % or lower, preferably 0.01 mass % or lower, and more preferably 0 mass % with respect to the total solid content of the composition.

«Solvent»

The composition according to the embodiment of the present invention includes a solvent. Examples of the solvent include an organic solvent and water, and it is preferable that the solvent includes at least an organic solvent. Examples of the organic solvent include an aliphatic hydrocarbon solvent, a halogenated hydrocarbon solvent, an alcohol solvent, an ether solvent, an ester solvent, a ketone solvent, a nitrile solvent, an amide solvent, a sulfoxide solvent, and an aromatic solvent.

Examples of the aliphatic hydrocarbon solvent include hexane, cyclohexane, methylcyclohexane, pentane, cyclopentane, heptane, and octane.

Examples of the halogenated hydrocarbon solvent include methylene chloride, chloroform, dichloromethane, ethane dichloride, carbon tetrachloride, trichloroethylene, tetrachloroethylene, epichlorohydrin, monochlorobenzene, orthodichlorobenzene, allylchloride, methyl monochloroacetate, ethyl monochloroacetate, monochloroacetate, trichloroacetate, methyl bromide, and tri(tetra)chloroethylene.

Examples of the alcohol solvent include methanol, ethanol, 1-propanol, 2-propanol, 2-butanol, ethylene glycol, propylene glycol, glycerin, 1,6-hexanediol, cyclohexanediol, sorbitol, xylitol, 2-methyl-2,4-pentanediol, 3-methoxy-1-butanol, 1,3-butanediol, and 1,4-butanediol.

Examples of the ether solvent include dimethyl ether, diethyl ether, diisopropyl ether, dibutyl ether, t-butyl methyl ether, cyclohexyl methyl ether, anisole, tetrahydrofuran, diethylene glycol, triethylene glycol, polyethylene glycol, dipropylene glycol, ethylene glycol monomethyl ether, ethylene glycol monobutyl ether, ethylene glycol monophenyl ether, propylene glycol monomethyl ether, propylene glycol monoethyl ether, propylene glycol monopropyl ether, propylene glycol monobutyl ether, diethylene glycol monomethyl ether, diethylene glycol monoethyl ether, diethylene glycol monopropyl ether, diethylene glycol monobutyl ether, diethylene glycol dimethyl ether, diethylene glycol diethyl ether, diethylene glycol dipropyl ether, diethylene glycol dibutyl ether, dipropylene glycol monomethyl ether, dipropylene glycol dimethyl ether, dipropylene glycol monoethyl ether, dipropylene glycol monopropyl ether, dipropylene glycol monobutyl ether, dipropylene glycol methyl-n-propyl ether, triethylene glycol monomethyl ether, triethylene glycol monobutyl ether, tripropylene glycol monomethyl ether, tripropylene glycol monobutyl ether, tetraethylene glycol dimethyl ether, polyethylene glycol monomethyl ether, and polyethylene glycol dimethyl ether.

Examples of the ester solvent include propylene carbonate, dipropylene, 1,4-butanediol diacetate, 1,3-butylene glycol diacetate, 1,6-hexanediol diacetate, cyclohexanol acetate, dipropylene glycol methyl ether acetate, methyl acetate, ethyl acetate, isopropyl acetate, n-propyl acetate, butyl acetate, ethylene glycol monomethyl ether acetate, propylene glycol monomethyl ether acetate, 3-methoxy butyl acetate, ethylene glycol monobutyl ether acetate, diethylene glycol monoethyl ether acetate, diethylene glycol monobutyl ether acetate, and triacetin.

Examples of the ketone solvent include acetone, methyl ethyl ketone, methyl isobutyl ketone, cyclopentanone, cyclohexanone, and 2-heptanone.

Examples of the nitrile solvent include acetonitrile.

Examples of the amide solvent include N,N-dimethylformamide, 1-methyl-2-pyrrolidone, 2-pyrrolidinone, 1,3-dimethyl-2-imidazolidinone, ε-caprolactam, formamide. N-methyl formamide, acetamide, N-methylacetamide, N,N-dimethylacetamide, N-methylpropaneamide, hexamethylphosphoric amide, 3-methoxy-N,N-dimethylpropanamide, and 3-butoxy-N,N-dimethylpropanamide.

Examples of the sulfoxide solvent include dimethyl sulfoxide.

Examples of the aromatic solvent include benzene and toluene.

The content of the solvent in the composition according to the embodiment of the present invention is preferably 70% to 99 mass %. The upper limit is preferably 93 mass % or lower, more preferably 92 mass % or lower, and still more preferably 90 mass % or lower. The lower limit is preferably 75 mass % or higher, more preferably 80 mass % or higher, and still more preferably 85 mass % or higher.

In the present invention, the solvent includes the solvent A1 having a boiling point of 190° C. to 280° C. The boiling point of the solvent in the present specification refers to a value at 1 atm (0.1 MPa).

From the viewpoint of effectively suppressing aggregation of the colloidal silica particles and suppressing the occurrence of defects, the boiling point of the solvent A1 is preferably 200° C. or higher, more preferably 210° C. or higher, and still more preferably 220° C. or higher. In addition, from the viewpoint of further reducing the residual solvent during film formation and easily forming a film having an excellent surface shape, the boiling point of the solvent A1 is preferably 270° C. or lower and more preferably 265° C. or lower.

From the viewpoint that the effect of the present invention can be easily obtained more significantly, the viscosity of the solvent A1 is preferably 10 mPa·s or lower, more preferably 7 mPa·s or lower, and still more preferably 4 mPa·s or lower. From the viewpoint of application properties, the lower limit of the viscosity of the solvent A1 is preferably 1.0 mPa·s or higher, more preferably 1.4 mPa·s or higher, and still more preferably 1.8 mPa·s or higher.

From the viewpoint that the effect of the present invention can be easily obtained more significantly, the molecular weight of the solvent A1 is preferably 100 or higher, more preferably 130 or higher, still more preferably 140 or higher, and still more preferably 150 or higher. From the viewpoint of application properties, the lower limit is preferably 300 or lower, more preferably 290 or lower, still more preferably 280 or lower, and still more preferably 270 or lower.

A solubility parameter of the solvent A1 is preferably 8.5 to 13.3 $(cal/cm^3)^{0.5}$. The upper limit is preferably 12.5 $(cal/cm^3)^{0.5}$ or lower, more preferably 11.5 $(cal/cm^3)^{0.5}$ or lower, and still more preferably 10.5 $(cal/cm^3)^{0.5}$ or lower. The lower limit is preferably 8.7 $(cal/cm^3)^{0.5}$ or higher, more preferably 8.9 $(cal/cm^3)^{0.5}$ or higher, and still more preferably 9.1 $(cal/cm^3)^{0.5}$ or higher. In a case where the solubility parameter of the solvent A1 is in the above-described range, high affinity to the colloidal silica particles can be obtained, and aggregation of the colloidal silica particles during application can be more effectively suppressed. 1 $(cal/cm^3)^{0.5}$ is 2.0455 $MPa^{0.5}$. In addition, the solubility parameter of the solvent is a value calculated using HSPiP.

In the present specification, as the solubility parameter of the solvent, a Hansen solubility parameter is used. Specifically, a value calculated using Hansen solubility parameter software "HSPiP 5.0.09" is used.

It is preferable that the solvent A1 is a non-protonic solvent. By using the non-protonic solvent as the solvent A1, aggregation of the colloidal silica particles during film formation can be more effectively suppressed.

As the solvent A1, an ether solvent, or an ester solvent is preferable, and an ester solvent is more preferable. In addition, it is preferable that the ester solvent used as the solvent A1 is a compound not having a hydroxyl group or a terminal alkoxy group. By using the ester solvent not having the functional group, the effect of the present invention can be easily obtained more significantly.

From the viewpoint that high affinity to the colloidal silica particles can be obtained and aggregation of the colloidal silica particles during application can be more effectively suppressed, it is preferable that the solvent A1 is at least one selected from alkylenediol diacetate or cyclic carbonate. Examples of the alkylenediol diacetate include propylene glycol diacetate, 1,4-butanediol diacetate, 1,3-butylene glycol diacetate, and 1,6-hexanediol diacetate. Examples of the cyclic carbonate include propylene carbonate and ethylene carbonate.

Specific examples of the solvent A1 include propylene carbonate (boiling point: 240° C.), ethylene carbonate (boiling point: 260° C.), propylene glycol diacetate (boiling point: 190° C.), dipropylene glycol methyl-n-propyl ether (boiling point: 203° C.), dipropylene glycol methyl ether acetate (boiling point: 213° C.), 1,4-butanediol diacetate (boiling point: 232° C.), 1,3-butylene glycol diacetate (boiling point: 232° C.), 1,6-hexanediol diacetate (boiling point: 260° C.), diethylene glycol monoethyl ether acetate (boiling point: 217° C.), diethylene glycol monobutyl ether acetate (boiling point: 247° C.), triacetin (boiling point: 260° C.), dipropylene glycol monomethyl ether (boiling point: 190° C.), diethylene glycol monoethyl ether (boiling point: 202° C.), dipropylene glycol monopropyl ether (boiling point: 212° C.), dipropylene glycol monobutyl ether (boiling point: 229° C.), tripropylene glycol monomethyl ether (boiling point: 242° C.), and tripropylene glycol monobutyl ether (boiling point: 274° C.).

In the solvent used in the composition according to the embodiment of the present invention, the content of the solvent A1 is preferably 3 mass % or higher, more preferably 4 mass % or higher, and still more preferably 5 mass % or higher. According to the aspect, the effect of the present invention can be easily obtained more significantly. The upper limit is preferably 20 mass % or lower, more preferably 15 mass % or lower, and still more preferably 12 mass % or lower. According to this aspect, a film having an excellent surface shape can be easily obtained. As the solvent A1, one kind may be used, or two or more kinds may be used in combination. In a case where the composition includes two or more solvents, it is preferable that the total content of the two or more solvents is in the above-described range.

It is preferable that the solvent used in the composition according to the embodiment of the present invention further includes a solvent A2 having a boiling point of 110° C. or higher and lower than 190° C. According to this aspect, the drying properties of the composition are appropriately improved such that the occurrence of coating unevenness can be effectively suppressed, and a film having an excellent surface shape can be easily formed.

The boiling point of the solvent A2 is preferably 115° C. or higher, more preferably 120° C. or higher, and still more preferably 130° C. or higher. In addition, the boiling point of the solvent A2 is preferably 170° C. or lower and more preferably 150° C. or lower. In a case where the boiling point of the solvent A2 is in the above-described range, the above-described effect can be easily obtained more significantly.

From the viewpoint that the above-described effect can be easily obtained more significantly, the molecular weight of the solvent A2 is preferably 100 or higher, more preferably 130 or higher, still more preferably 140 or higher, and still more preferably 150 or higher. From the viewpoint of application properties, the lower limit is preferably 300 or lower, more preferably 290 or lower, still more preferably 280 or lower, and still more preferably 270 or lower.

A solubility parameter of the solvent A2 is preferably 9.0 to 11.4 $(cal/cm^3)^{0.5}$. The upper limit is preferably 11.0 $(cal/cm^3)^{0.5}$ or lower, more preferably 10.6 $(cal/cm^3)^{0.5}$ or lower, and still more preferably 10.2 $(cal/cm^3)^{0.5}$ or lower. The lower limit is preferably 9.2 $(cal/cm^3)^{0.5}$ or higher, more preferably 9.4 $(cal/cm^3)^{0.5}$ or higher, and still more preferably 9.6 $(cal/cm^3)^{0.5}$ or higher. In a case where the solubility parameter of the solvent A2 is in the above-described range, high affinity to the colloidal silica particles can be obtained, and aggregation of the colloidal silica particles during application can be more effectively suppressed. In addition an absolute value of a difference between the solubility parameter of the solvent A1 and the solubility parameter of the solvent A2 is preferably 0.01 to 1.1 $(cal/cm^3)^{0.5}$. The upper limit is preferably 0.9 $(cal/cm^3)^{0.5}$ or lower, more preferably 0.7 $(cal/cm^3)^{0.5}$ or lower, and still more preferably 0.5 $(cal/cm^3)^{0.5}$ or lower. The lower limit is preferably 0.03 $(cal/cm^3)^{0.5}$ or higher, more preferably 0.05 $(cal/cm^3)^{0.5}$ or higher, and still more preferably 0.08 $(cal/cm^3)^{0.5}$ or higher.

It is preferable that the solvent A2 is at least one selected from an ether solvent or an ester solvent, it is more preferable that the solvent A2 includes an ester solvent, and it is still more preferable that the solvent A2 includes an ether solvent and an ester solvent. Specific examples of the solvent A2 include cyclohexanol acetate (boiling point: 173° C.), dipropylene glycol dimethyl ether (boiling point: 175° C.), butyl acetate (boiling point: 126° C.), ethylene glycol monomethyl ether acetate (boiling point: 145° C.), propylene glycol monomethyl ether acetate (boiling point: 146° C.), 3-methoxy butyl acetate (boiling point: 171° C.), propylene glycol monomethyl ether (boiling point: 120° C.), 3-methoxybutanol (boiling point: 161° C.), propylene glycol monopropyl ether (boiling point: 150° C.), propylene glycol monobutyl ether (boiling point: 170° C.), and ethylene glycol monobutyl ether acetate (boiling point: 188° C.). From the viewpoint that high affinity to the colloidal silica particles can be obtained and aggregation of the colloidal silica particles during application can be more effectively suppressed, it is preferable that the solvent A2 includes propylene glycol monomethyl ether acetate.

In a case where the solvent used in the composition according to the embodiment of the present invention includes the solvent A2, the content of the solvent A2 is preferably 500 to 5000 parts by mass with respect to 100 parts by mass of the solvent A1. The upper limit is preferably 4500 parts by mass or less, more preferably 4000 parts by mass or less, and still more preferably 3500 parts by mass or less. The lower limit is preferably 600 parts by mass or more, more preferably 700 parts by mass or more, and still more preferably 750 parts by mass or more. In addition, the content of the solvent A2 is preferably 50 mass % or higher, more preferably 60 mass % or higher, and still more preferably 70 mass % or higher with respect to the total content of the solvent. The upper limit is preferably 95 mass % or lower, more preferably 90 mass % or lower, and still more preferably 85 mass % or lower. In a case where the content of the solvent A2 is in the above-described range, the effect of the present invention can be easily obtained more significantly. As the solvent A2, one kind may be used, or two or more kinds may be used in combination. In a case where the composition includes two or more solvents, it is preferable that the total content of the two or more solvents is in the above-described range.

In addition, in the solvent used in the composition according to the embodiment of the present invention, the total content of the solvent A1 and the solvent A2 is preferably 62 mass % or higher, more preferably 72 mass % or higher, and still more preferably 82 mass % or higher. The upper limit may be 100 mass %, 96 mass % or lower, or 92 mass % or lower.

It is preferable that the solvent used in the composition according to the embodiment of the present invention further includes at least one solvent A3 selected from methanol, ethanol, or 2-propyl alcohol. According to this aspect, high affinity to the colloidal silica particles can be obtained. In a case where the solvent used in the composition according to the embodiment of the present invention includes the solvent A3, the content of the solvent A3 is preferably 0.1% to 10 mass % with respect to the total content of the solvent. The upper limit is preferably 8 mass % or lower, more preferably 6 mass % or lower, and still more preferably 4 mass % or lower. The lower limit is preferably 0.3 mass % or higher, more preferably 0.5 mass % or higher, and still more preferably 1 mass % or higher. In a case where the content of the solvent A3 is in the above-described range, the above-described effect can be easily obtained more significantly. As the solvent A3, one kind may be used, or two or more kinds may be used in combination. In a case where the composition includes two or more solvents, it is preferable that the total content of the two or more solvents is in the above-described range.

It is also preferable that the solvent used in the composition according to the embodiment of the present invention further includes water. According to this aspect, high affinity to the colloidal silica particles can be obtained. In a case where the solvent used in the composition according to the embodiment of the present invention includes water, the content of water is preferably 0.1% to 5 mass % with respect to the total content of the solvent. The upper limit is preferably 4 mass % or lower, more preferably 2.5 mass % or lower, and still more preferably 1.5 mass % or lower. The lower limit is preferably 0.3 mass % or higher, more preferably 0.5 mass % or higher, and still more preferably 1.0 mass % or higher. In a case where the content of water is in the above-described range, the above-described effect can be easily obtained more significantly.

It is also preferable that the solvent used in the composition according to the embodiment of the present invention includes the solvent A3 and water. According to this aspect, high affinity to the colloidal silica particles can be obtained. In a case where the solvent used in the composition according to the embodiment of the present invention includes the solvent A3 and water, the total content of the solvent A3 and water is preferably 0.2% to 15 mass % with respect to the total content of the solvent. The upper limit is preferably 12 mass % or lower, more preferably 9 mass % or lower, and still more preferably 6 mass % or lower. The lower limit is preferably 0.4 mass % or higher, more preferably 0.7 mass % or higher, and still more preferably 1.5 mass % or higher. In a case where the total content of the solvent A3 and water is in the above-described range, the above-described effect can be easily obtained more significantly.

The solvent used in the composition according to the embodiment of the present invention may include a solvent A4 having a boiling point of higher than 280° C. According to this aspect, the drying properties of the composition are appropriately improved such that the occurrence of coating unevenness can be effectively suppressed, and a film having an excellent surface shape can be easily formed. The upper limit of the boiling point of the solvent A4 is preferably 400° C. or lower, more preferably 380° C. or lower, and still more preferably 350° C. or lower. It is preferable that the solvent A4 is at least one selected from an ether solvent or an ester solvent. Specific examples of the solvent A4 include polyethylene glycol monomethyl ether. In a case where the solvent used in the composition according to the embodiment of the present invention includes the solvent A4, the content of the solvent A4 is preferably 0.5% to 15 mass % with respect to the total content of the solvent. The upper limit is preferably 10 mass % or lower, more preferably 8 mass % or lower, and still more preferably 6 mass % or lower. The lower limit is preferably 1 mass % or higher, more preferably 1.5 mass % or higher, and still more preferably 2 mass % or higher. In addition, it is also preferable that the solvent used in the composition according to the embodiment of the present invention does not substantially include the solvent A4. A case where the solvent does not substantially include the solvent A4 represents that the content of the solvent A4 is 0.1 mass % or lower, preferably 0.05 mass % or lower, more preferably 0.01 mass % or lower, and still more preferably 0 mass % with respect to the total content of the solvent.

The solvent used in the composition according to the embodiment of the present invention may include solvents (other solvents) other than the solvent A1, the solvent A2, the solvent A3, the solvent A4, and water but preferably does not include the other solvents. A case where the solvent does not substantially include the other solvents represents that the content of the other solvents is 0.1 mass % or lower, preferably 0.05 mass % or lower, more preferably 0.01 mass % or lower, and still more preferably 0 mass % with respect to the total content of the solvent.

In the solvent used in the composition according to the embodiment of the present invention, the content of a compound having a molecular weight (in the case of a polymer, weight-average molecular weight) of higher than 300 is preferably 10 mass % or lower, more preferably 8 mass % or lower, still more preferably 5 mass % or lower, still more preferably 3 mass % or lower, and still more preferably 1 mass % or lower. According to this aspect, higher application properties can be easily obtained, and a film having an excellent surface shape can be easily obtained.

In the solvent used in the composition according to the embodiment of the present invention, the content of a compound having a viscosity of higher than 10 mPa·s at 25° C. is preferably 10 mass % or lower, more preferably 8 mass % or lower, still more preferably 5 mass % or lower, still more preferably 3 mass % or lower, and still more preferably 1 mass % or lower. According to this aspect, higher application properties can be easily obtained, and a film having an excellent surface shape can be easily obtained.

«Surfactant»

It is preferable that the composition according to the embodiment of the present invention includes a surfactant. As the surfactant, any one of a nonionic surfactant, a cationic surfactant, or an anionic surfactant may be used. As the nonionic surfactant, a fluorine surfactant is preferable. In particular, a fluorine surfactant, an anionic surfactant, a cationic surfactant is preferable, and a fluorine surfactant is more preferable.

In the present invention, it is also preferable that the composition includes a surfactant having a polyoxyalkylene structure. The polyoxyalkylene structure refers to a structure in which an alkylene group and a divalent oxygen atom are present adjacent to each other, and specific examples thereof include an ethylene oxide (EO) structure and a propylene oxide (PO) structure. The polyoxyalkylene structure may constitute a graft chain of an acrylic polymer.

In a case where the surfactant is a polymer compound, the weight-average molecular weight of the surfactant is preferably 1500 or higher, more preferably 2500 or higher, still more preferably 5000 or higher, and still more preferably 10000 or higher. The upper limit is preferably 50000 or lower, more preferably 25000 or lower, and still more preferably 17500 or lower.

The fluorine surfactant is preferably a polymer surfactant having a polyethylene main chain. In particular, a polymer surfactant having a poly(meth)acrylate structure is preferable. In particular, in the present invention, a copolymer of a (meth)acrylate constitutional unit having the polyoxyalkylene structure and a fluorinated alkylacrylate constitutional unit is preferable.

In addition, as the fluorine surfactant, a compound having a fluoroalkyl group or a fluoroalkylene group (preferably having 1 to 24 carbon atoms and more preferably 2 to 12 carbon atoms) at any site can be suitably used. Preferably, a polymer compound having the fluoroalkyl group or the fluoroalkylene group at a side chain can be used. It is preferable that the fluorine surfactant further includes the polyoxyalkylene structure, and it is more preferable that the fluorine surfactant includes the polyoxyalkylene structure at a side chain. Examples of the compound having the fluoroalkyl group or the fluoroalkylene group include a compound described in paragraphs "0034" to "0040" of WO2015/190374A, the content of which is incorporated herein by reference.

Examples of the fluorine surfactant include MEGAFACE F171, F172, F173, F176, F177, F141, F142, F143, F144, R30, F437, F479, F482, F554, F559, F780, and F781F (all of which are manufactured by DIC Corporation); FLUORAD FC430, FC431, and FC171 (all of which are manufactured by Sumitomo 3M Ltd.); SURFLON 5-382, S-141, 5-145, SC-101, SC-103, SC-104, SC-105, SC1068, SC-381, SC-383, S-393, and KH-40 (all of which are manufactured by Asahi Glass Co., Ltd.); F-TOP EF301, EF303, EF351, EF352 (all of which are manufactured by Gemco Inc.); and PF636, PF656, PF6320, PF6520, and PF7002 (all of which manufactured by OMNOVA Solutions Inc.).

In addition, as the fluorine surfactant, a block polymer can also be used. Examples of the block polymer include a compound described in JP2011-089090A. As the fluorine surfactant, a fluorine-containing polymer compound can be preferably used, the fluorine-containing polymer compound including: a repeating unit derived from a (meth)acrylate compound having a fluorine atom; and a repeating unit derived from a (meth)acrylate compound having 2 or more (preferably 5 or more) alkyleneoxy groups (preferably an ethyleneoxy group and a propyleneoxy group). For example, the following compound can also be used as the fluorine surfactant used in the present invention.

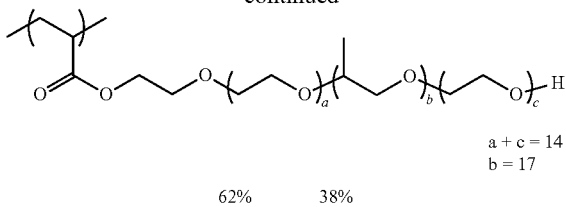

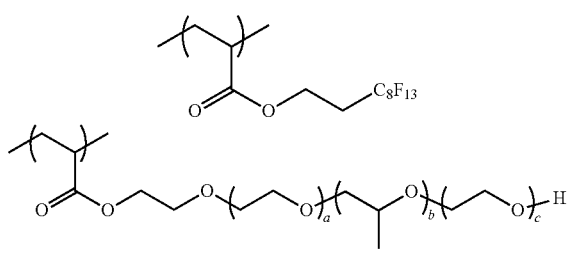

a + c = 14
b = 17

62%   38%

The weight-average molecular weight of the compound is preferably 3000 to 50000 and, for example, 14000. In the compound, "%" representing the proportion of a repeating unit is mol %.

Examples of the nonionic surfactant, the anionic surfactant, and the cationic surfactant other than the fluorine surfactant include a surfactant described in paragraphs "0042" to "0045" of WO2015/190374A, the content of which is incorporated herein by reference.

In a case where the composition according to the embodiment of the present invention includes a surfactant, the content of the surfactant in the composition according to the embodiment of the present invention is preferably 0.001 mass % or higher, more preferably 0.005 mass % or higher, and still more preferably 0.01 mass % or higher. The upper limit is preferably 0.1 mass % or lower, more preferably 0.05 mass % or lower, and still more preferably 0.03 mass % or lower. In addition, the content of the surfactant in the composition according to the embodiment of the present invention is preferably 0.01 mass % or higher, more preferably 0.05 mass % or higher, and still more preferably 0.1 mass % or higher with respect to the total solid content of the composition according to the embodiment of the present invention. The upper limit is preferably 1 mass % or lower, more preferably 0.5 mass % or lower, and still more preferably 0.3 mass % or lower. In a case where the content of the surfactant is in the above-described range, application properties of the composition can be further improved. The composition may include one surfactant or two or more surfactants. In a case where the composition includes two or more surfactants, it is preferable that the total content of the two or more surfactants is in the above-described range.

In addition, it is also preferable that the composition according to the embodiment of the present invention does not substantially include a surfactant. In a case where the composition according to the embodiment of the present invention does not substantially include a surfactant, a hydrophilic film is likely to be laminated on a film formed using the composition according to the embodiment of the present invention. A case where the composition according to the embodiment of the present invention does not substantially include the surfactant represents that the content of the surfactant is 0.005 mass % or lower, preferably 0.001 mass % or lower, and more preferably 0 mass % with respect to the total solid content of the composition.

《Dispersant》

The composition according to the embodiment of the present invention may include a dispersant. Examples of the dispersant include: a polymer dispersant (for example, polyamideamine or a salt thereof, a polycarboxylic acid or a salt thereof, a high-molecular-weight unsaturated acid ester, a modified polyurethane, a modified polyester, a modified poly(meth)acrylate, a (meth)acrylic copolymer, or a naphthalene sulfonic acid formalin condensate), polyoxyethylene alkyl phosphoric acid ester, polyoxyethylene alkyl amine, and alkanol amine. In terms of a structure, the polymer dispersant can be further classified into a linear polymer, a terminal-modified polymer, a graft polymer, and a block polymer. The polymer dispersant adsorbs on surfaces of particles and functions to prevent reaggregation. Therefore, for example, a terminal-modified polymer a graft polymer, or a block polymer having an anchor site to particle surfaces can be used as a preferable structure. As the dispersant, a commercially available product can also be used. Examples of the commercially available product include products described in paragraph "0050" of WO2016/190374A, the content of which is incorporated herein by reference.

The content of the dispersant is preferably 1 to 100 parts by mass, more preferably 3 to 100 parts by mass, and still more preferably 5 to 80 parts by mass with respect to 100 parts by mass of the content of $SiO_2$ including the colloidal silica particles. In addition, the content of the dispersant is preferably 1 to 30 mass % with respect to the total solid content of the composition. The composition may include one dispersant or two or more dispersants. In a case where the composition includes two or more dispersants, it is preferable that the total content of the two or more dispersants is in the above-described range.

«Polymerizable Compounds»

The composition according to the embodiment of the present invention includes a polymerizable compound. As the polymerizable compound, a well-known compound which is crosslinkable by a radical, an acid, or heat can be used. In the present invention, it is preferable that the polymerizable compound is a radically polymerizable compound. It is preferable that the radically polymerizable compound is a compound having an ethylenically unsaturated bond group.

The polymerizable compound may be in any chemical form of a monomer, a prepolymer, an oligomer, or the like and is preferably a monomer. The molecular weight of the polymerizable compound is preferably 100 to 3000. The upper limit is more preferably 2000 or lower and still more preferably 1500 or lower. The lower limit is more preferably 150 or higher and still more preferably 250 or higher.

As the polymerizable compound, a compound having two or more ethylenically unsaturated bond groups is preferable, and a compound having three or more ethylenically unsaturated bond groups is more preferable. The upper limit of the number of the ethylenically unsaturated bond groups is, for example, preferably 15 or less and more preferably 6 or less. Examples of the ethylenically unsaturated bond group include a vinyl group, a styryl group, a (meth)allyl group, and a (meth)acryloyl group. Among these, a (meth)acryloyl group is preferable. The polymerizable compound is preferably a (meth)acrylate compound having 3 to 15 functional groups and more preferably a (meth)acrylate compound having 3 to 6 functional groups. Specific examples of the polymerizable compound include a compound described in paragraphs "0059" to "0079" of WO2016/190374A.

As the polymerizable compound, dipentaerythritol triacrylate (KAYARAD D-330 as a commercially available product; manufactured by Nippon Kayaku Co., Ltd.), dipentaerythritol tetraacrylate (KAYARAD D-320 as a commercially available product; manufactured by Nippon Kayaku Co., Ltd.), dipentaerythritol penta(meth)acrylate (KAYARAD D-310 as a commercially available product; manufactured by Nippon Kayaku Co., Ltd.), dipentaerythritol hexa(meth)acrylate (KAYARAD DPHA as a commercially available product; manufactured by Nippon Kayaku Co., Ltd., NK ESTER A-DPH-12E as a commercially available product; manufactured by Shin-Nakamura Chemical Co., Ltd.), a compound (for example, SR454 or SR499; manufactured by Sartomer) having a structure in which these (meth)acryloyl groups are bonded through an ethylene glycol and/or a propylene glycol residue, diglycerin ethylene oxide (EO)-modified (meth)acrylate (as a commercially available product, M-460 manufactured by Toagosei Co., Ltd.), pentaerythritol tetraacrylate (NK ESTER A-TMMT manufactured by Shin-Nakamura Chemical Co., Ltd.). 1,6-hexanediol diacrylate (KAYARAD HDDA manufactured by Nippon Kayaku Co., Ltd.), RP-1040 (manufactured by Nippon Kayaku Co., Ltd.), ARONIX TO-2349 (manufactured by Toagosei Co., Ltd.), NK OLIGO UA-7200 (manufactured by Shin-Nakamura Chemical Co., Ltd.), 8UH-1006 or 8UH-1012 (manufactured by Taisei Fine Chemical Co., Ltd.), or LIGHT ACRYLATE POB-A0 (manufactured by Kyoeisha Chemical Co., Ltd.) can be used.

In addition, as the polymerizable compound, a trifunctional (meth)acrylate compound such as trimethylolpropane tri(meth)acrylate, trimethylolpropane propyleneoxide-modified tri(meth)acrylate, trimethylolpropane ethyleneoxide-modified tri(meth)acrylate, isocyanuric acid ethyleneoxide-modified (meth)acrylate, or pentaerythritol tri(meth)acrylate is also preferably used. Examples of a commercially available product of the trifunctional (meth)acrylate compound include ARONIX M-309, M-310, M-321, M-350, M-360, M-313, M-315, M-306, M-305, M-303, M-452, and M-450 (all of which are manufactured by Toagosei Co., Ltd.). NK ESTER A9300, A-GLY-9E, A-GLY-20E, A-TMM-3, A-TMM-3L, A-TMM-3LM-N, A-TMPT, and TMPT (manufactured by Shin-Nakamura Chemical Co., Ltd.), KAYARAD GPO-303, TMPTA, THE-330, TPA-330, and PET-30 (manufactured by Nippon Kayaku Co., Ltd.).

As the polymerizable compound, a compound having an acid group can also be used. By using the polymerizable compound having an acid group, a non-exposed portion of the polymerizable compound is likely to be removed during development, and the occurrence of development residue can be suppressed. Examples of the acid group include a carboxyl group, a sulfo group, and a phosphate group. Among these, a carboxyl group is preferable. Examples of a commercially available product of the polymerizable compound having an acid group include ARONIX M-510, ARONIX M-520, and ARONIX TO-2349 (manufactured by Toagosei Co., Ltd.). The acid value of the polymerizable compound having an acid group is preferably 0.1 to 40 mgKOH/g and more preferably 5 to 30 mgKOH/g. In a case where the acid value of the polymerizable compound is 0.1 mgKOH/g or higher, solubility in the developer is excellent. In a case where the acid value of the polymerizable compound is 40 mgKOH/g or lower, there are advantageous effects in manufacturing and handleability.

In addition, it is also preferable that the polymerizable compound is a compound having a caprolactone structure. As the polymerizable compound having a caprolactone structure, for example, KAYARAD DPCA series (manufactured by manufactured by Nippon Kayaku Co., Ltd.) is commercially available, and examples thereof include DPCA-20, DPCA-30, DPCA-60, and DPCA-120.

As the polymerizable compound, a polymerizable compound having an alkyleneoxy group may also be used. As the polymerizable compound having an alkyleneoxy group, a polymerizable compound having an ethyleneoxy group and/or a propyleneoxy group is preferable, a polymerizable compound having an ethyleneoxy group is more preferable, and a trifunctional to hexafunctional (meth)acrylate compound having 4 to 20 ethyleneoxy groups is still more preferable. Examples of a commercially available product of the polymerizable compound having an alkyleneoxy group include SR-494 (manufactured by Sartomer) which is a tetrafunctional (meth)acrylate having four ethyleneoxy groups, and KAYARAD TPA-330 which is a trifunctional (meth)acrylate having three isobutyleneoxy groups.

As the polymerizable compound, a polymerizable compound having a fluorene skeleton can also be used. Examples of a commercially available product of the polymerizable compound having a fluorene skeleton include OGSOL EA-0200 and EA-0300 (manufactured by Osaka Gas Chemicals Co., Ltd., a (meth)acrylate monomer having a fluorene skeleton).

In addition, it is preferable that a compound substantially not including an environmentally regulated material such as toluene is also used as the polymerizable compound. Examples of a commercially available product of the compound include KAYARAD DPHA LT and KAYARAD DPEA-12 LT (manufactured by Nippon Kayaku Co., Ltd.).

In a case where the composition according to the embodiment of the present invention includes a polymerizable compound, the content of the polymerizable compound in the composition according to the embodiment of the present invention is preferably 0.1 mass % or higher, more preferably 0.2 mass % or higher, still more preferably 0.5 mass % or higher. The upper limit is preferably 10 mass % or lower, more preferably 5 mass % or lower, and still more preferably 3 mass % or lower. The content of the polymerizable compound is preferably 1 mass % or higher, more preferably 2 mass % or higher, and still more preferably 5 mass % or higher with respect to the total solid content of the composition according to the embodiment of the present invention. The upper limit is preferably 30 mass % or lower, more preferably 25 mass % or lower, and still more preferably 20 mass % or lower.

In addition, it is also preferable that the composition according to the embodiment of the present invention does not substantially include a polymerizable compound. In a case where the composition according to the embodiment of the present invention does not substantially include a polymerizable compound, an effect of avoiding the occurrence of haze caused by insufficient compatibility between the polymerizable compound and silica can be expected. A case where the composition according to the embodiment of the present invention does not substantially include the polymerizable compound represents that the content of the polymerizable compound is 0.05 mass % or lower, preferably 0.01 mass % or lower, and more preferably 0 mass % with respect to the total solid content of the composition.

«Photopolymerization Initiator»

In a case where the composition according to the embodiment of the present invention includes a polymerizable compound, it is preferable that the composition further includes a photopolymerization initiator. In a case where the composition according to the embodiment of the present invention includes a polymerizable compound and a photopolymerization initiator, the composition according to the embodiment of the present invention can be preferably used as a composition for forming a pattern using a photolithography method.

The photopolymerization initiator is not particularly limited as long as it has an ability to initiate the polymerization of the polymerizable compound, and can be appropriately selected from well-known photopolymerization initiators. In a case where the radically polymerizable compound is used as the polymerizable compound, it is preferable that the photoradical polymerization initiator is used as the photopolymerization initiator. Examples of the photoradical polymerization initiator include a trihalomethyltriazine compound, a benzyldimethylketal compound, an α-hydroxyketone compound, an α-aminoketone compound, an acylphosphine compound, a phosphine oxide compound, a metallocene compound, an oxime compound, a triarylimidazole dimer, an onium compound, a benzothiazole compound, a benzophenone compound, an acetophenone compound, a cyclopentadiene-benzene-iron complex, a halomethyl oxadiazole compound, and a coumarin compound. Among these, an oxime compound, an α-hydroxyketone compound, an α-aminoketone compound, or an acylphosphine compound is preferable, an oxime compound or an α-aminoketone compound is more preferable, and an oxime compound is still more preferable. Examples of the photopolymerization initiator include a compound described in paragraphs "0099" to "0125" of JP2015-166449A, the content of which is incorporated herein by reference.

Examples of the oxime compound include a compound described in JP2001-233842A, a compound described in J. C. S. Perkin II (1979, pp. 1653 to 1660), a compound described in J. C. S. Perkin II (1979, pp. 156 to 162), a compound described in Journal of Photopolymer Science and Technology (1995, pp. 202 to 232), a compound described in JP2000-066385A, a compound described in JP2000-080068A, a compound described in JP2004-534797A, a compound described in JP2006-342166A, a compound described in JP2017-019766A, a compound described in JP6065596B, a compound described in WO2015/152153A, a compound described in WO2017/051680A, a compound described in JP2017-198865A, and a compound described in paragraphs "0025" to "0038" of WO2017/164127A. Specific examples of the oxime compound include 3-benzoyloxyiminobutane-2-one, 3-acetoxyiminobutane-2-one, 3-propionyloxyiminobutane-2-one, 2-acetoxyiminopentane-3-one, 2-acetoxyimino-1-phenylpropane-1-one, 2-benzoyloxyimino-1-phenylpropane-1-one, 3-(4-toluene sulfonyloxy)iminobutane-2-one, and 2-ethoxycarbonyloxyimino-1-phenylpropane-1-one.

Examples of a commercially available product of the oxime compound include IRGACURE-OXE01, IRGACURE-OXE02, IRGACURE-OXE03, or IRGACURE-OXE04 (all of which are manufactured by BASF SE), TR-PBG-304 (manufactured by Changzhou Tronly New Electronic Materials Co., Ltd.), and ADEKA OPTOMER N-1919 (manufactured by Adeka Corporation, a photopolymerization initiator 2 described in JP2012-014052A). As the oxime compound, a compound having no colorability or a compound having high transparency that is not likely to be discolored can also be preferably used. Examples of a commercially available product of the oxime compound include ADEKA ARKLS NCI-730, NCI-831, and NCI-930 (all of which are manufactured by Adeka Corporation).

In the present invention, an oxime compound having a fluorene ring can also be used as the photopolymerization initiator. Specific examples of the oxime compound having a fluorene ring include a compound described in JP2014-137466A. The content of the present specification is incorporated herein by reference.

In the present invention, an oxime compound having a fluorine atom can also be used as the photopolymerization initiator. Specific examples of the oxime compound having a fluorine atom include a compound described in JP2010-262028A, Compound 24 and 36 to 40 described in JP2014-500852A, and Compound (C-3) described in JP2013-164471A. The content of the present specification is incorporated herein by reference.

In the present invention, as the photopolymerization initiator, an oxime compound having a nitro group can be used.

It is preferable that the oxime compound having a nitro group is a dimer. Specific examples of the oxime compound having a nitro group include compounds described in paragraphs "0031" to "0047" of JP2013-114249A and paragraphs "0008" to "0012" and "070" to "0079" of JP2014-137466A, compounds described in paragraphs "0007" to 0025" of JP4223071B, and ADEKA ARKLS NCI-831 (manufactured by Adeka Corporation).

In the present invention, as the photopolymerization initiator, an oxime compound having a benzofuran skeleton can also be used. Specific examples include OE-01 to OE-75 described in WO2015/036910A.

The oxime compound is preferably a compound having a maximum absorption wavelength in a wavelength range of 350 to 500 nm and more preferably a compound having a maximum absorption wavelength in a wavelength range of 360 to 480 nm. In addition, the molar absorption coefficient of the oxime compound at a wavelength of 365 nm or 405 nm is preferably high, more preferably 1000 to 300000, still more preferably 2000 to 300000, and still more preferably 5000 to 200000 from the viewpoint of sensitivity. The molar absorption coefficient of the compound can be measured using a well-known method. For example, it is preferable that the molar absorption coefficient can be measured using a spectrophotometer (Cary-5 spectrophotometer, manufactured by Varian Medical Systems, Inc.) and ethyl acetate as a solvent at a concentration of 0.01 g/L.

As the photopolymerization initiator, a photoradical polymerization initiator having two functional groups or three or more functional groups may be used. By using this photoradical polymerization initiator, two or more radicals are generated from one molecule of the photoradical polymerization initiator. Therefore, excellent sensitivity can be obtained. In addition, in a case where a compound having an asymmetric structure is used, crystallinity deteriorates, solubility in an organic solvent or the like is improved, precipitation is not likely to occur over time, and temporal stability of the composition can be improved. Specific examples of the photoradical polymerization initiator having two functional groups or three or more functional groups include a dimer of an oxime compound described in JP2010-527339A, JP2011-524436A, WO2015/004565A, paragraphs "0412" to "0417" of JP2016-532675A, or paragraphs "0039" to "0055" of WO2017/033680A, a compound (E) and a compound (G) described in JP2013-522445A, Cmpd 1 to 7 described in WO2016/034963A, an oxime ester photoinitiator described in paragraph "0007" of JP2017-523465A, a photoinitiator described in paragraphs "0020" to "0033" of JP2017-167399A, and a photopolymerization initiator (A) described in paragraphs "0017" to "0026" of JP2017-151342A.

In a case where the composition according to the embodiment of the present invention includes a photopolymerization initiator, the content of the photopolymerization initiator in the composition according to the embodiment of the present invention is preferably 0.1 mass % or higher, more preferably 0.2 mass % or higher, still more preferably 0.5 mass % or higher. The upper limit is preferably 10 mass % or lower, more preferably 5 mass % or lower, and still more preferably 3 mass % or lower. The content of the photopolymerization initiator is preferably 1 mass % or higher, more preferably 2 mass % or higher, and still more preferably 5 mass % or higher with respect to the total solid content of the composition according to the embodiment of the present invention. The upper limit is preferably 30 mass % or lower, more preferably 25 mass % or lower, and still more preferably 20 mass % or lower. In addition, the content of the photopolymerization initiator is preferably 10 to 1000 parts by mass with respect to 100 parts by mass of the polymerizable compound. The upper limit is preferably 500 parts by mass or less, more preferably 300 parts by mass or less, and still more preferably 100 parts by mass or less. The lower limit is preferably 20 parts by mass or more, more preferably 40 parts by mass or more, and still more preferably 60 parts by mass or more.

In addition, it is also preferable that the composition according to the embodiment of the present invention does not substantially include a photopolymerization initiator. A case where the composition according to the embodiment of the present invention does not substantially include the photopolymerization initiator represents that the content of the photopolymerization initiator is 0.005 mass % or lower, preferably 0.001 mass % or lower, and more preferably 0 mass % with respect to the total solid content of the composition.

《Resin》

The composition according to the embodiment of the present invention may further include a resin. The weight-average molecular weight (Mw) of the resin is preferably 3000 to 2000000. The upper limit is preferably 1000000 or lower and more preferably 500000 or lower. The lower limit is preferably 4000 or higher and more preferably 5000 or higher.

Examples of the resin include a (meth)acrylic resin, an enethiol resin, a polycarbonate resin, a polyether resin, a polyarylate resin, a polysulfone resin, a polyethersulfone resin, a polyphenylene resin, a polyarylene ether phosphine oxide resin, a polyimide resin, a polyamide imide resin, a polyolefin resin, a cyclic olefin resin, a polyester resin, a styrene resin, and a silicone resin. Among these resins, one kind may be used alone, or a mixture of two or more kinds may be used. In addition, a resin described in paragraphs "0041" and "0060" of JP2017-206689A, a resin described in paragraphs "0022" and "0071" of JP2018-010856A, a resin described in JP2017-057265A, a resin described in JP2017-032685A, a resin described in JP2017-075248A, a resin described in JP2017-066240A, or a resin described in paragraph "0016" of JP2018-145339A can also be used.

In the present invention, it is preferable that a resin having an acid group is also used as the resin. According to this aspect, in a case where a pattern is formed using a photolithography method, the developability can be further improved. Examples of the acid group include a carboxyl group, a phosphate group, a sulfo group, and a phenolic hydroxyl group. Among these, a carboxyl group is preferable. The resin having an acid group can be used as, for example, an alkali-soluble resin.

It is preferable that the resin having an acid group further includes a repeating unit having an acid group at a side chain, and it is more preferable that the content of the repeating unit having an acid group at a side chain is 5 to 70 mol % with respect to all the repeating units of the resin. The upper limit of the content of the repeating unit having an acid group at a side chain is preferably 50 mol % or lower and more preferably 30 mol % or lower. The lower limit of the content of the repeating unit having an acid group at a side chain is preferably 10 mol % or higher and more preferably 20 mol % or higher.

The acid value of the resin having an acid group is preferably 30 to 500 mgKOH/g. The lower limit is preferably 50 mgKOH/g or higher and more preferably 70 mgKOH/g or higher. The upper limit is preferably 400 mgKOH/g or lower, more preferably 300 mgKOH/g or lower, and still more preferably 200 mgKOH/g or lower. The weight-average molecular weight (Mw) of the resin having an acid group is preferably 5000 to 100000. In addition, the number-average molecular weight (Mn) of the resin having an acid group is preferably 1000 to 20000.

In a case where the composition according to the embodiment of the present invention includes a resin, the content of the resin in the composition according to the embodiment of the present invention is preferably 0.01 mass % or higher, more preferably 0.05 mass % or higher, still more preferably 0.1 mass % or higher. The upper limit is preferably 2 mass % or lower, more preferably 1 mass % or lower, and still more preferably 0.5 mass % or lower. The content of the resin is preferably 0.2 mass % or higher, more preferably 0.7 mass % or higher, and still more preferably 1.2 mass % or higher with respect to the total solid content of the composition according to the embodiment of the present invention. The upper limit is preferably 18 mass % or lower, more preferably 12 mass % or lower, and still more preferably 5 mass % or lower.

«Adherence Improving Agent»

The composition according to the embodiment of the present invention may further include an adherence improving agent. By the composition including the adherence improving agent, a film having excellent adhesiveness with a support can be formed. Preferable examples of the adherence improving agent include adherence improving agents described in JP1993-011439A (JP-H5-011439A), JP1993-341532A (JP-H5-341532A), and JP1994-043638A (JP-H6-043638A). Specific examples of the adherence improving agent include benzimidazole, benzoxazole, benzothiazole, 2-mercaptobenzimidazole, 2-mercaptobenzoxazole, 2-mercaptobenzothiazole, 3-morpholinomethyl-1-phenyl-triazole-2-thione, 3-morpholinomethyl-5-phenyl-oxadiazole-2-thione, 5-amino-3-morpholinomethyl-thiadiazole-2-thione, 2-mercapto-5-methylthiothiadiazole, triazole, tetrazole, benzotiazole, carboxybenzotriazole, an amino group-containing benzotriazole, and a silane coupling agent. As the adherence improving agent, a silane coupling agent is preferable.

As the silane coupling agent, a compound having an alkoxysilyl group as a hydrolyzable group that can form a chemical bond with an inorganic material is preferable. In addition, a compound having a group which interacts with a resin or forms a bond with a resin to exhibit affinity is preferable, and examples of the group include a vinyl group, a styryl group, a (meth)acryloyl group, a mercapto group, an epoxy group, an oxetanyl group, an amino group, an ureido group, a sulfide group, and an isocyanate group. Among these, a (meth)acryloyl group or an epoxy group is preferable.

As the silane coupling agent, a silane compound that has at least two functional groups having different reactivities in one molecule is also preferable. In particular, a compound having an amino group and alkoxy group as functional groups is preferable. Examples of the silane coupling agent include N-β-aminoethyl-γ-aminopropyl-methyldimethoxysilane (KBM-602, manufactured by Shin-Etsu Chemical Co., Ltd.), N-β-aminoethyl-γ-aminopropyl-trimethoxysilane (KBM-603, manufactured by Shin-Etsu Chemical Co., Ltd.), N-β-aminoethyl-γ-aminopropyl-triethoxysilane (KBE-602, trade name, manufactured by Shin-Etsu Chemical Co., Ltd.), γ-aminopropyl-trimethoxysilane (KBM-903, trade name, manufactured by Shin-Etsu Chemical Co., Ltd.), γ-aminopropyl-triethoxysilane (KBE-903, trade name, manufactured by Shin-Etsu Chemical Co., Ltd.), and 3-methacryloxypropyltrimethoxysilane (KBM-503, trade name, manufactured by Shin-Etsu Chemical Co., Ltd.). As the silane coupling agent, the following compounds can also be used. In the following structural formulae, Et represents an ethyl group.

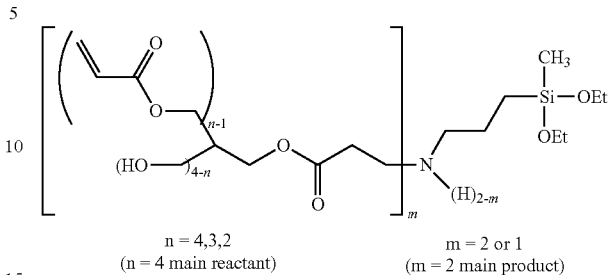

n = 4,3,2
(n = 4 main reactant)

m = 2 or 1
(m = 2 main product)

In a case where the composition according to the embodiment of the present invention includes an adherence improving agent, the content of the adherence improving agent is preferably 0.001 mass % or higher, more preferably 0.01 mass % or higher, still more preferably 0.1 mass % or higher with respect to the total solid content in the composition according to the embodiment of the present invention. The upper limit is preferably 20 mass % or lower, more preferably 10 mass % or lower, and still more preferably 5 mass % or lower. In addition, it is also preferable that the composition according to the embodiment of the present invention does not substantially include an adherence improving agent. A case where the composition according to the embodiment of the present invention does not substantially include the adherence improving agent represents that the content of the adherence improving agent is 0.0005 mass % or lower, preferably 0.0001 mass % or lower, and more preferably 0 mass % with respect to the total solid content of the composition according to the embodiment of the present invention.

From the viewpoint of stabilizing dispersion of the colloidal silica particles in the composition and easily suppressing the occurrence of aggregated foreign matter, an absolute value of a zeta potential of the present invention is preferably 25 mV or higher, more preferably 29 mV or higher, still more preferably 33 mV or higher, and still more preferably 37 mV or higher. The upper limit of the absolute value of the zeta potential is preferably 90 mV or lower and is preferably 16 mV or higher, and more preferably 70 mV or lower.

In addition, from the viewpoint of easily stabilizing dispersion of the colloidal silica particles in the composition, the zeta potential of the present invention is preferably −70 to −25 mV. The lower limit is preferably −60 mV or higher, more preferably −50 mV or higher, and still more preferably −45 mV or higher. The upper limit is preferably −34 mV or lower, more preferably −31 mV or lower, and still more preferably −28 mV or lower.

In a case where the potential of an electrically neutral solvent portion that is sufficiently spaced from the particles in the fine particle dispersion liquid is zero, the zeta potential refers to a potential on an internal plane (slipping plane) of an electric double layer that moves together with particles among potentials developed by surface charge of the particles and the electric double layer derived from the vicinity of the surface.

In addition, in the present specification, the zeta potential of the composition is a value measured by electrophoresis. Specifically, the electrophoretic mobility of fine particles are measured using a zeta potential measuring device (Zetasizer Nano, manufactured by Malvern Panalytical Ltd.), and the zeta potential is obtained from the Debye-Huckel equation.

As measurement conditions, a universal dip cell is used, a voltage at which particles appropriately migrate even after application of a voltage of 40 V or 60 V is selected, and an attenuator and an analysis model are set to an automatic mode, the measurement is repeated 20 times, and the average value thereof is obtained as the zeta potential of a sample. The sample is used as it is without performing a pre-treatment such as dilution thereon.

In a case where the composition according to the embodiment of the present invention is applied to a glass substrate and is heated at 200° C. for 5 minutes to form a film having a thickness of 0.5 μm, a contact angle of the above-described film with water at 25° C. is preferably 300 or more, more preferably 350 or more, still more preferably 40° or more, and still more preferably 45° or more. From the viewpoint of the application properties of the composition, the upper limit is preferably 700 or less, more preferably 65° or less, and still more preferably 600 or less. The contact angle is a value measured using a method of DM-701 (manufactured by Kyowa Interface Science Co., Ltd.).

The refractive index of the film formed using the composition according to the embodiment of the present invention is preferably 1.5 or lower, more preferably 1.4 or lower, still more preferably 1.3 or lower, and still more preferably 1.24 or lower. The lower limit is preferably 1.1 or more. Unless specified otherwise, the value of the refractive index is a value measured at 25° C. using light having a wavelength of 633 nm.

It is preferable that the film has sufficient hardness. The Young's modulus of the film is preferably 2 or higher, more preferably 3 or higher, and still more preferably 4 or higher. The upper limit value is, for example, preferably 10 or lower.

The thickness of the film varies depending on the use. For example, the thickness of the film is preferably 5 μm or less, more preferably 3 μm or less, and still more preferably 1.5 μm or less. The lower limit value is not particularly limited and is preferably 50 nm or more.

The composition according to the embodiment of the present invention can be preferably used as a composition for forming an optical functional layer in an optical device such as a display panel, a solar cell, an optical lens, a camera module, or an optical sensor. Examples of the optical functional layer include an antireflection layer, a low refractive index layer, and a waveguide.

In addition, the composition according to the embodiment of the present invention can be preferably used as a composition for forming a partition wall. Examples of the partition wall include a partition wall dividing pixels adjacent to each other in a case where pixels are formed on an imaging area of a solid-state imaging element. Examples of the pixel include a colored pixel, a transparent pixel, and a pixel of a near infrared transmitting filter layer. For example, a partition wall for forming a grid structure for dividing pixels can be used. Examples of the partition wall include structures described in JP2012-227478A, JP2010-0232537A, JP2009-111225A, FIG. 1 of JP2017-028241A. and FIG. 4D of JP2016-201524A, the contents of which are incorporated herein by reference. In addition, for example, a partition wall for forming a frame structure around an optical filter such as a color filter or a near infrared transmitting filter can be used. Examples of the partition wall include a structure described in JP2014-048596A, the content of which is incorporated herein by reference.

In addition, the composition according to the embodiment of the present invention can also be used for manufacturing an optical sensor or the like. Examples of the optical sensor include an image sensor such as a solid-state imaging element. Examples of one aspect of the optical sensor include a configuration in which the film formed using the composition according to the embodiment of the present invention is applied to an antireflection film on a microlens, an intermediate film, or a partition wall such as a grid disposed in a frame of a color filter or a near infrared transmitting filter or between pixels. Examples of one embodiment of the optical sensor include a structure configured with a light-receiving element (photodiode), a lower planarizing film, an optical filter, an upper planarizing film, or a microlens. Examples of the optical filter include a filter including a colored pixel of red (R), green (G), blue (B), or the like or a pixel of a near infrared transmitting filter layer.

<Method of Manufacturing Composition>

The composition according to the embodiment of the present invention can be manufactured by mixing the above-described compositions. During the manufacturing of the composition, it is preferable that the composition is filtered through a filter, for example, in order to remove foreign matter or to reduce defects. As the filter, any filter which is used in the related art for filtering or the like can be used without any particular limitation. Examples of a material of the filter include: a fluororesin such as polytetrafluoroethylene (PTFE); a polyamide resin such as nylon; and a polyolefin resin (including a polyolefin resin having a high density and an ultrahigh molecular weight) such as polyethylene or polypropylene (PP). Among these materials, polypropylene (including high-density polypropylene) or nylon is preferable.

The pore size of the filter is preferably 0.1 to 7 μm, more preferably 0.2 to 2.5 μm, still more preferably 0.2 to 1.5 μm, and still more preferably 0.3 to 0.7 μm. In a case where the pore size of the filter is in the above-described range, fine foreign matter can be more reliably removed. The pore size value of the filter can refer to a nominal value of a manufacturer of the filter. As the filter, various filters manufactured by Pall Corporation (for example, DFA4201NIEY), Toyo Roshi Kaisha, Ltd., Entegris Japan Co., Ltd. (former Mykrolis Corporation), or Kits Microfilter Corporation can be used.

In a filter is used, a combination of different filters may be used. In this case, the filtering using each of the filters may be performed once, or twice or more. In addition, a combination of filters having different pore sizes may be used.

<Storage Container>

A storage container of the composition according to the embodiment of the present invention is not particularly limited, and a well-known storage container can be used. In addition, as the storage container, in order to suppress infiltration of impurities into the raw materials or the composition, a multilayer bottle in which a container inner wall having a six-layer structure is formed of six kinds of resins or a bottle in which a container inner wall having a seven-layer structure is formed of six kinds of resins is preferably used. Examples of the container include a container described in JP2015-123351A.

In addition, it is also preferable that the inner wall of the storage container is formed of glass or stainless steel. According to this aspect, elution of metal from the container inner wall can be prevented, the storage stability of the composition can be improved, and component deterioration of the composition can be suppressed.

<Film Forming Method>

Next, a film forming method according to the embodiment of the present invention will be described. In the film forming method according to the embodiment of the present invention, the above-described composition according to the embodiment of the present invention is used. It is preferable that the film forming method includes a step of applying the above-described composition to a support to form a composition layer.

Examples of a method of applying the composition include: a drop casting method, a slit coating method; a spray coating method; a roll coating method: a spin coating method; a cast coating method: a slit and spin method; a pre-wetting method (for example, a method described in JP2009-145395A): various printing methods including jet printing such as an ink jet method (for example, an on-demand method, a piezoelectric method, or a thermal method) or a nozzle jet method, flexographic printing, screen printing, gravure printing, reverse offset printing, and metal mask printing: a transfer method using a mold or the like; and a nanoimprint lithography method. The application method using an ink jet method is not particularly limited, and examples thereof include a method (in particular, pp. 115 to 133) described in "Extension of Use of Ink Jet—Infinite Possibilities in Patent—" (February, 2005, S.B. Research Co., Ltd.) and methods described in JP2003-262716A, JP2003-185831A, JP2003-261827A, JP2012-126830A, and JP2006-169325A. In addition, it is preferable that the application using a spin coating method is performed at a rotation speed of 1000 to 2000 rpm. In addition, during the coating using a spin coating method, the rotation speed may be increased as described in JP1998-142603A (JP-H10-142603A), JP1999-302413A (JP-H11-302413A), or JP2000-157922A. In addition, a spin coating process described in "Process Technique and Chemicals for Latest Color Filter" (Jan. 31, 2006. CMC Publishing Co., Ltd.) can also be suitably used.

Regarding the application using a spin coating method, in a case where the composition is applied to the support, a method (dynamic dispense method) of dropping the composition from the nozzle while rotating the support without stopping the rotation of the support may be performed. It is preferable that the application using a spin coating method is performed while changing the rotation speed stepwise. For example, it is preferable that the film forming method includes a main rotation step for determining the film thickness and a dry rotation step for performing drying as desired. In addition, in a case where the time of the main rotation step is short at 10 seconds or shorter, the rotation speed of the subsequent dry rotation step for performing drying as desired is preferably 400 rpm to 1200 rpm and more preferably 600 rpm to 1000 rpm. In addition, from the viewpoints of suppressing striation and performing drying as desired, the time of the main rotation step preferably 1 second to 20 seconds, more preferably 2 seconds to 15 seconds, and still more preferably 2.5 seconds to 10 seconds. As the time of the main rotation step decreases in the above-described range, the occurrence of striation can be more effectively suppressed. In addition, in the case of the dynamic dispense method, in order to suppress coating unevenness, it is also preferable that a difference between the rotation speed during the dropwise addition of the composition and the rotation speed during the main rotation step decreases.

The support to which the composition is applied is appropriately selected depending on the use. Examples of the support include a substrate formed of a material such as silicon, non-alkali glass, soda glass, PYREX (registered trade name) glass, or quartz glass. In addition, for example, an InGaAs substrate is preferably used. The InGaAs substrate has excellent sensitivity to light having a wavelength of longer than 1000 nm. Therefore, by forming the respective near infrared transmitting filter layers on the InGaAs substrate, an optical sensor having excellent sensitivity to light having a wavelength of longer than 1000 nm is likely to be obtained. In addition, a charge coupled device (CCD), a complementary metal-oxide semiconductor (CMOS), a transparent conductive film, or the like may be formed on the support. In addition, a black matrix formed of a light shielding material such as tungsten may also be formed on the support. In addition, an underlayer may be provided on the support to improve adhesiveness with a layer above the support, to prevent diffusion of materials, or to make a surface of the substrate flat. In addition, as the support, a microlens can also be used. By applying the composition according to the embodiment of the present invention to the microlens, a microlens unit having a surface coated with a film formed of the composition according to the embodiment of the present invention can be obtained. This microlens unit can be used in combination with an optical sensor such as a solid-state imaging element.

In the present invention, the composition layer formed on the support may be dried (pre-baked). It is preferable that drying is performed using a hot plate, an oven, or the like at a temperature of 50° C. to 140° C. for 10 seconds to 300 seconds.

In addition, the composition layer may be further heated (post-baked) after drying. The post-baking temperature is preferably 250° C. or lower, more preferably 240° C. or lower, and still more preferably 230° C. or lower. The lower limit is not particularly limited, and is preferably 50° C. or higher and more preferably 100° C. or higher.

In addition, in the present invention, an adhesion treatment may be performed on the composition layer that is dried (post-baked in a case where post-baking is performed). Examples of the adhesion treatment include a HMDS treatment. As the treatment, hexamethyldisilazane (HMDS) is used. In a case where HMDS is applied to the composition layer formed using the composition according to the embodiment of the present invention, HMDS reacts with a Si—OH bond present on the surface to form Si—O—Si (CH$_3$)$_3$. As a result, the surface of the composition layer can be made hydrophobic. This way, by making the surface of the composition layer hydrophobic, in a case where a resist pattern described below is formed on the composition layer, the infiltration of a developer into the composition layer can be prevented while improving the adhesiveness of the resist pattern.

The film forming method according to the embodiment of the present invention may further include a step of forming a pattern. Examples of the step of forming a pattern include a pattern forming method using a photolithography method and a pattern forming method using an etching method.

(Pattern Formation Using Photolithography Method)

First, a case where a pattern is formed with a photolithography method using the composition according to the embodiment of the present invention will be described. It is preferable that the pattern formation using the photolithography method includes: a step of forming a composition layer on a support using the composition according to the embodiment of the present invention; a step of exposing the composition layer in a pattern shape; and a step of forming a pattern by removing a non-exposed portion of the composition layer by development. Optionally, the pattern formation further includes: a step (pre-baking step) of baking the composition layer; and a step (post-baking step) of baking the developed pattern.

In the step of forming a composition layer, a composition layer is formed on a support using the composition according to the embodiment of the present invention. Examples of the support include the above-described examples. Examples of a method of applying the composition include the above-described methods. The composition layer formed on the support may be dried (pre-baked). It is preferable that drying is performed using a hot plate, an oven, or the like at a temperature of 50° C. to 140° C. for 10 seconds to 300 seconds.

Next, the composition layer is exposed in a pattern shape (exposure step). For example, the composition layer can be exposed in a pattern shape using a stepper exposure device or a scanner exposure device through a mask having a predetermined mask pattern. As a result, an exposed portion can be cured.

Examples of radiation (light) used during the exposure include a g-ray and an i-ray. In addition, light having a wavelength of 300 nm or shorter (preferably light having a wavelength of 180 to 300 nm) can also be used. Specific examples of the light having a wavelength of 300 nm or shorter include a KrF ray (wavelength: 248 nm) and an ArF ray (wavelength. 193 nm). Among these, a KrF ray (wavelength: 248 nm) is preferable. In addition, a long-wavelength light source of 300 nm or longer can also be used.

In addition, during the exposure the composition may be continuously irradiated with and exposed to light or may be irradiated with and exposed (pulse exposure) to pulses of the light. The pulse exposure refers to an exposure method in which light irradiation and rest are repeated in a cycle of a short period of time (for example, a level of milliseconds or lower). In the case of pulse exposure, the pulse duration is preferably 100 nanoseconds (ns) or shorter, more preferably 50 nanoseconds or shorter, and still more preferably 30 nanoseconds or shorter. The lower limit of the pulse duration is not particularly limited and may be 1 femtosecond (fs) or longer or 10 femtoseconds (fs) or longer. The frequency is preferably 1 kHz or higher, more preferably 2 kHz or higher, and still more preferably 4 kHz or higher. The upper limit of the frequency is preferably 50 kHz or lower, more preferably 20 kHz or lower, and still more preferably 10 kHz or lower. The maximum instantaneous illuminance is preferably 50000000 W/m$^2$ or higher, more preferably 100000000 W/m$^2$ or higher, and still more preferably 200000000 W/m$^2$ or higher. In addition, the upper limit of the maximum instantaneous illuminance is preferably 1000000000 W/m$^2$ or lower, more preferably 800000000 W % m$^2$ or lower, and still more preferably 500000000 W/m$^2$ or lower. The pulse duration refers to the time during which light is irradiated during a pulse period. In addition, the frequency refers to the number of pulse periods per second. In addition, the maximum instantaneous illuminance refers to an average illuminance within a time during which light is irradiated in a pulse period. In addition, the pulse period refers to a period in which light irradiation and rest during pulse exposure are set as one cycle.

The irradiation dose (exposure dose) is preferably 0.03 to 2.5 J/cm$^2$, and more preferably 0.05 to 1.0 J/cm$^2$. The oxygen concentration during exposure can be appropriately selected. The exposure may be performed not only in air but also in a low-oxygen atmosphere having an oxygen concentration of 19 vol % or lower (for example, 15 vol %, 5 vol %, or substantially 0 vol %) or in a high-oxygen atmosphere having an oxygen concentration of higher than 21 vol % (for example, 22 vol %, 30 vol %, or 50 vol %). In addition, the exposure illuminance can be appropriately set and typically can be selected in a range of 1000 W/m$^2$ to 100000 W/m$^2$ (for example, 5000 W/m$^2$, 15000 W/m$^2$, or 35000 W/m$^2$). Conditions of the oxygen concentration and conditions of the exposure illuminance may be appropriately combined. For example, conditions are oxygen concentration: 10 vol % and illuminance: 10000 W/m$^2$, or oxygen concentration: 35 vol % and illuminance: 20000 W/m$^2$.

Next, a pattern is formed by removing a non-exposed portion of the composition layer by development. The non-exposed portion of the composition layer can be removed by development using a developer. As a result, a non-exposed portion of the composition laver in the exposure step is eluted into the developer, and only the photo-cured portion remains. Examples of the developer include an alkali developer and an organic solvent. Among these, an alkali developer is preferable. For example, the temperature of the developer is preferably 20° C. to 30° C. The development time is preferably 20 to 180 seconds.

As the alkali developer, an alkaline aqueous solution in which the above alkaline agent (alkali developer) is diluted with pure water is preferable. Examples of the alkaline agent include: an organic alkaline compound such as ammonia, ethylamine, diethylamine, dimethylethanolamine, diglycolamine, diethanolamine, hydroxyamine, ethylenediamine, tetramethylammonium hydroxide, tetraethylammonium hydroxide, tetrapropylammonium hydroxide, tetrabutylammonium hydroxide, ethyltrimethylammonium hydroxide, benzyltrimethylammonium hydroxide, dimethyl bis(2-hydroxyethyl)ammonium hydroxide, choline, pyrrole, piperidine, or 1,8-diazabicyclo[5.4.0]-7-undecene; and an inorganic alkaline compound such as sodium hydroxide, potassium hydroxide, sodium carbonate, sodium bicarbonate, sodium silicate, or sodium metasilicate. From the viewpoints of environment and safety, it is preferable that the alkaline agent is a compound having a high molecular weight. A concentration of the alkaline agent in the alkaline aqueous solution is preferably 0.001 to 10 mass % and more preferably 0.01 to 1 mass %. In addition, the developer may further include a surfactant. Examples of the surfactant include the above-described surfactants. Among these, a nonionic surfactant is preferable. From the viewpoint of easiness of transport, storage, and the like, the developer may be obtained by temporarily manufacturing a concentrated solution and diluting the concentrated solution to a necessary concentration during use. The dilution factor is not particularly limited and, for example, can be set to be in a range of 1.5 to 100 times. In addition, it is also preferable that the composition is rinsed with pure water after development. In addition, it is preferable that, during rinsing, a rinsing liquid is supplied to the developed composition layer while rotating the support on which the developed composition layer is formed. In addition, it is also preferable that, during rinsing, a nozzle through which the rinsing liquid is ejected is moved from a center portion of the support to a peripheral portion of the support. In this case, during the movement of the nozzle from the center portion to the peripheral portion of the support, the moving speed of the nozzle may be gradually decreased. By performing rinsing as described above, an in-plane variation of rinsing can be suppressed. In addition, even in a case where the rotation speed of the support is gradually decreased while moving the nozzle from the center portion to the peripheral portion of the support, the same effects can be obtained.

It is preferable that, after the development and drying, an additional exposure treatment or a heating treatment (post-baking) is performed. The additional exposure treatment or the post-baking is a curing treatment which is performed after development to completely cure the film. The heating temperature during post-baking is preferably 250° C. or lower, more preferably 240° C. or lower, and still more preferably 230° C. or lower. The lower limit is not particularly limited, and is preferably 50° C. or higher and more preferably 100° C. or higher. In a case where the additional exposure treatment is performed, the light used for exposure is preferably light having a wavelength of 400 nm or shorter. In addition, the additional exposure treatment may be performed using a method described in KR1020170122130A.
(Pattern Formation Using Etching Method)

Next, a case where a pattern is formed with an etching method using the composition according to the embodiment of the present invention will be described. It is preferable that the pattern formation using an etching method include: a step of forming a composition layer on a support using the composition according to the embodiment of the present invention and curing the entire composition layer to form a cured composition layer; a step of forming a photoresist layer on the cured composition layer; a step of exposing the photoresist layer in a pattern shape and developing the exposed photoresist layer to form a resist pattern; a step of etching the cured composition layer using this resist pattern as a mask; and a step of peeling and removing the resist pattern from the cured composition layer.

A resist used for forming the resist pattern is not particularly limited. For example, a resist including an alkali-soluble phenol resin and naphthoquinone diazide described in pp. 16 to 22 of "Polymer New Material One Point 3, Microfabrication and Resist, Saburo Nonogaki, Published by Kyoritsu Shuppan Co., Ltd. (First Edition, Nov. 15, 1987) can be used. In addition, a resist described in Examples of JP2568883B, JP2761786B, JP2711590B, JP2987526B, JP3133881B, JP3501427B, JP3373072B, JP3361636B, or JP1994-054383A (JP-H6-054383A) can also be used. In addition, as the resist, a so-called chemically amplified resist can also be used. Examples of the chemically amplified resist include a resist described in p. 129~ of "New Developments of Photo-functional Polymer Materials", (May 31, 1996, first print, edited by Kunihiro Ichimura, published by CMC) (in particular, a resist including a polyhydroxystyrene resin in which a hydroxyl group is protected by an acid-decomposable group that is described in about page 131 or an ESCAP (Environmentally Stable Chemical Amplification Positive Resist) type resist that is described in about page 131 is preferable). In addition, a resist described in, for example, Examples of JP2008-268875A, JP2008-249890A, JP2009-244829A, JP2011-013581A, JP2011-232657A, JP2012-003070A, JP2012-003071A, JP3638068B, JP4006492B, JP4000407B, or JP4194249B can also be used.

A method of etching the cured composition layer may be dry etching or wet etching. Among these, dry etching is preferable.

It is preferable to dry-etching the cured composition layer by using mixed gas of fluorine gas and $O_2$ as etching gas. A mixing ratio (fluorine gas/$O_2$) of fluorine gas to $O_2$ is preferably 4/1 to 1/5 and more preferably 1/2 to 1/4 by flow rate ratio. Examples of the fluorine gas include $CF_4$, $C_2F_6$, $C_3F_8$, $C_2F_4$, $C_4F_8$, $C_4F_6$, $C_5F_8$, and $CHF_3$. Among these, $C_4F_6$, $C_5F_8$, $C_4F_8$, or $CHF_3$ is preferable, $C_4F_6$ or $C_5F_8$ is more preferable, and $C_4F_6$ is still more preferable. As the fluorine gas, one kind of gas can be selected from the above-described group, and a mixed gas including two or more kinds of gases may be used.

From the viewpoint of maintaining partial pressure control stability of etching plasma and verticality of an etched shape, the mixed gas may further include, in addition to the fluorine gas and $O_2$, noble gas such as helium (He), neon (Ne), argon (Ar), krypton (Kr), or xenon (Xe). As another other gas that may be mixed, one kind of gas or two or more kinds of gases can be selected from the above-described group. In a case where the flow rate ratio of $O_2$ is represented by 1, the mixing ratio of the other gas that may be used is preferably higher than 0 and 25 or lower, more preferably 10 to 20, and still more preferably 16.

The internal pressure of a chamber during dry etching is preferably 0.5 to 6.0 Pa and more preferably 1 to 5 Pa.

Examples of dry etching conditions include conditions described in paragraphs "0102" to "0108" of WO2015/190374A or JP2016-014856A, the contents of which are incorporated herein by reference.

The film forming method according to the embodiment of the present invention is also applicable to manufacturing of an optical sensor or the like.

EXAMPLES

Next, the present invention will be described using Examples, but the present invention is not limited thereto. Unless specified otherwise, amounts or ratios shown in Examples are represented by mass.

<Method of Measuring Viscosity>

The viscosity of a measurement sample was measured using a viscometer RE85L (manufactured by Toki Sangyo Co., Ltd., rotor: 1°34'×R24 measurement range 0.6 to 1200 mPa·s) after adjusting the temperature of the measurement sample to 25° C. The liquid amount used was set to 1.5 mL and a value 2 minutes after the measurement start was obtained as a measured value.

<Preparation of Composition>

The respective components were mixed to obtain a composition shown in the following table and was filtered through DFA4201NIEY (0.45 m nylon filter, manufactured by Pall Corporation) to obtain a composition.

TABLE 1

| | | Silica Particle Solution 1 | Silica Particle Solution 2 | Surfactant | Polymerizable Compound | Photopolymerization Initiator | Solvent A1 | Solvent A2 | | Solvent | | |
|---|---|---|---|---|---|---|---|---|---|---|---|---|
| | | | | | | | | | | | Other Solvent | |
| Example 1 | Kind | P1 | — | F1 | — | — | A1-3 | A2-1 | — | LC-OH | — | W |
| | Mixing Amount | 10 | — | 0.02 | — | — | 8 | 75 | — | 4 | — | 3 |
| Example 2 | Kind | P1 | — | F1 | — | — | A1-4 | A2-1 | — | LC-OH | — | W |
| | Mixing Amount | 10 | — | 0.02 | — | — | 8 | 75 | — | 4 | — | 3 |
| Example 3 | Kind | P1 | — | F1 | — | — | A1-5 | A2-1 | — | LC-OH | — | W |
| | Mixing Amount | 10 | — | 0.02 | — | — | 8 | 75 | — | 4 | — | 3 |

TABLE 1-continued

| | | Silica Particle Solution 1 | Silica Particle Solution 2 | Sur-factant | Poly-merizable Compound | Photopoly-merization Initiator | Solvent A1 | Solvent A2 | | LC-OH | Other Solvent | W |
|---|---|---|---|---|---|---|---|---|---|---|---|---|
| Example 4 | Kind | P1 | — | F1 | — | — | A1-6 | A2-3 | — | LC-OH | — | W |
| | Mixing Amount | 10 | — | 0.02 | — | — | 8 | 75 | — | 4 | — | 3 |
| Example 5 | Kind | P1 | — | F1 | — | — | A1-7 | A2-1 | — | LC-OH | — | W |
| | Mixing Amount | 10 | — | 0.02 | — | — | 4 | 79 | — | 4 | — | 3 |
| Example 6 | Kind | P1 | — | F1 | — | — | A1-7 | A2-1 | — | LC-OH | — | W |
| | Mixing Amount | 10 | — | 0.02 | — | — | 8 | 75 | — | 4 | — | 3 |
| Example 7 | Kind | P1 | — | F1 | — | — | A1-7 | A2-1 | — | LC-OH | — | W |
| | Mixing Amount | 10 | — | 0.02 | — | — | 12 | 71 | — | 4 | — | 3 |
| Example 8 | Kind | P1 | — | F1 | — | — | A1-8 | A2-1 | — | LC-OH | — | W |
| | Mixing Amount | 10 | — | 0.02 | — | — | 8 | 75 | — | 4 | — | 3 |
| Example 9 | Kind | P1 | — | F1 | — | — | A1-11 | A2-1 | — | LC-OH | — | W |
| | Mixing Amount | 10 | — | 0.02 | — | — | 8 | 75 | — | 4 | — | 3 |
| Example 10 | Kind | P1 | — | F1 | — | — | A1-12 | A2-1 | — | LC-OH | — | W |
| | Mixing Amount | 10 | — | 0.02 | — | — | 8 | 75 | — | 4 | — | 3 |
| Example 11 | Kind | P1 | — | F1 | — | — | A1-13 | A2-1 | — | LC-OH | — | W |
| | Mixing Amount | 10 | — | 0.02 | — | — | 8 | 75 | — | 4 | — | 3 |
| Example 12 | Kind | P1 | — | F1 | — | — | A1-15 | A2-1 | — | LC-OH | — | W |
| | Mixing Amount | 10 | — | 0.02 | — | — | 8 | 75 | — | 4 | — | 3 |
| Example 13 | Kind | P1 | — | F1 | — | — | A1-17 | A2-1 | — | LC-OH | — | W |
| | Mixing Amount | 10 | — | 0.02 | — | — | 8 | 75 | — | 4 | — | 3 |
| Example 14 | Kind | P1 | PR1 | F1 | — | — | A1-17 | A2-1 | — | LC-OH | — | W |
| | Mixing Amount | 8 | 2 | 0.02 | — | — | 8 | 75 | — | 4 | — | 3 |
| Example 15 | Kind | P1 | — | F1 | M1 | I1 | A1-6 | A2-1 | — | LC-OH | — | W |
| | Mixing Amount | 10 | — | 0.02 | 2 | 2 | 8 | 71 | — | 4 | — | 3 |
| Example 16 | Kind | P1 | — | F1 | — | — | A1-6 | A2-1 | A2-2 | LC-OH | — | W |
| | Mixing Amount | 10 | — | 0.02 | — | — | 8 | 55 | 20 | 4 | — | 3 |
| Example 17 | Kind | P1 | — | F1 | — | — | A1-6 | A2-1 | A2-2 | LC-OH | — | W |
| | Mixing Amount | 10 | — | 0.02 | — | — | 8 | 40 | 35 | 4 | — | 3 |
| Example 18 | Kind | P1 | — | F1 | — | — | A1-6 | A2-1 | A2-2 | LC-OH | MPEG | W |
| | Mixing Amount | 10 | — | 0.02 | — | — | 4 | 40 | 35 | 4 | 4 | 3 |
| Example 19 | Kind | P1 | — | F1 | — | — | A1-6 | A2-1 | A2-2 | LC-OH | — | W |
| | Mixing Amount | 10 | — | 0.5 | — | — | 8 | 40 | 35 | 4 | — | 3 |
| Example 20 | Kind | P1 | — | F2 | — | — | A1-6 | A2-1 | A2-2 | LC-OH | — | W |
| | Mixing Amount | 10 | — | 0.02 | — | — | 8 | 40 | 35 | 4 | — | 3 |
| Example 21 | Kind | P1 | — | F2 | — | — | A1-6 | A2-1 | A2-2 | LC-OH | — | W |
| | Mixing Amount | 10 | — | 0.2 | — | — | 8 | 40 | 35 | 4 | — | 3 |
| Comparative Example 1 | Kind | P1 | — | F1 | — | — | A1-18 | A2-1 | — | LC-OH | — | W |
| | Mixing Amount | 10 | — | 0.02 | — | — | 8 | 75 | — | 4 | — | 3 |
| Comparative Example 2 | Kind | P1 | — | F1 | — | — | — | A2-1 | — | LC-OH | — | W |
| | Mixing Amount | 10 | — | 0.02 | — | — | — | 83 | — | 4 | — | 3 |
| Comparative Example 3 | Kind | — | PR1 | F1 | — | — | A1-6 | A2-1 | — | LC-OH | — | W |
| | Mixing Amount | — | 10 | 0.02 | — | — | 8 | 75 | — | 4 | — | 3 |

Numerical values of the mixing amounts in the following table are represented by "part(s) by mass". In addition, the mixing amount of a silica particle solution is a value in terms of the solid content of $SiO_2$ of the silica particle solution. A numerical value of the mixing amount of the solvent is the sum of the amounts of the solvents included in the silica particle solution. The raw materials shown above in the table are as follows.

(Silica Particle Solution)

P1: a solution of colloidal silica particles in which a plurality of spherical silica particles having an average particle size of 15 nm were linked in a beaded shape through metal oxide-containing silica (linking material). The average particle size of the spherical silica particles was 15 nm (the concentration of solid contents in terms of $SiO_2$ was 14 mass %).

PR1: THRULYA 4110 (manufactured by JGC C&C, silica particle solution having an average particle size of 60 nm and a concentration of solid contents of 20 mass % in terms of $SiO_2$. The silica particle solution including colloidal silica particles in which a plurality of spherical silica particles were linked in a beaded shape and colloidal silica particles in which a plurality of spherical silica particles were linked in a planar shape)

As the average particle size of the spherical silica particles in the silica particle solution P1, a number average value of circle equivalent diameters of projection images of spherical portions of 50 spherical silica particles measured using a transmission electron microscope (TEM) was calculated and obtained. In addition, whether or not each of the silica particle solutions P1 and PR1 included colloidal silica particles in which a plurality of spherical silica particles were linked in a beaded shape and colloidal silica particles in which a plurality of spherical silica particles were linked in a planar shape was investigated using a method of TEM observation.

(Solvent A1)

A1-3: propylene glycol diacetate (boiling point: 190° C., viscosity: 2.7 mPa·s, molecular weight: 160)

A1-4: dipropylene glycol methyl-n-propyl ether (boiling point: 203° C., viscosity: 1.4 mPa·s, molecular weight: 190)

A1-5: dipropylene glycol monomethyl ether acetate (boiling point: 213° C., viscosity: 1.7 mPa·s, molecular weight: 190)

A1-6: 1,4-butanediol diacetate (boiling point: 232° C., viscosity: 3.1 mPa·s, molecular weight: 174)

A1-7: 1,3-butylene glycol diacetate (boiling point: 232° C., viscosity: 2.9 mPa·s, molecular weight: 174)

A1-8: 1,6-hexanediol diacetate (boiling point: 260° C., viscosity: 3.9 mPa·s, molecular weight: 202)

A1-11: diethylene glycol monoethyl ether acetate (boiling point: 217° C., viscosity: 2.5 mPa·s, molecular weight: 176)

A1-12: diethylene glycol monobutyl ether acetate (boiling point: 247° C., viscosity: 3.1 mPa·s, molecular weight: 204)

A1-13: triacetin (boiling point: 260° C., viscosity: 17.5 mPa·s, molecular weight: 218)

A1-15: diethylene glycol monoethyl ether (boiling point: 202° C., viscosity: 3.9 mPa·s, molecular weight: 134)

A1-17: propylene carbonate (boiling point: 240° C., viscosity: 2.8 mPa·s, molecular weight: 102)

A1-18: ethylene glycol (boiling point: 197° C., viscosity: 16.1 mPa·s, molecular weight: 62)

(Solvent A2)

A2-1: propylene glycol monomethyl ether acetate (boiling point: 146° C., viscosity: 1.1 mPa·s, molecular weight: 132)

A2-2: propylene glycol monomethyl ether (boiling point: 120° C., molecular weight: 90, viscosity=1.8 mPa·s)

(Other Solvents)

LC-OH: ethanol, methanol, a mixture thereof
(boiling point of methanol=64° C., viscosity of methanol=0.6 mPa·s, boiling point of ethanol=78° C., viscosity of ethanol=1.2 mPa·s)

MPEG: polyethylene glycol monomethyl ether (molecular weight: 220, boiling point: 290° C. to 310° C., viscosity=12.8 mPa·s)

W: water (boiling point: 100° C., viscosity: 0.9 mPa·s)

(Surfactant)

F1: a compound having the following structure (Mw=14000, "%" representing the proportion of a repeating unit is mol %)

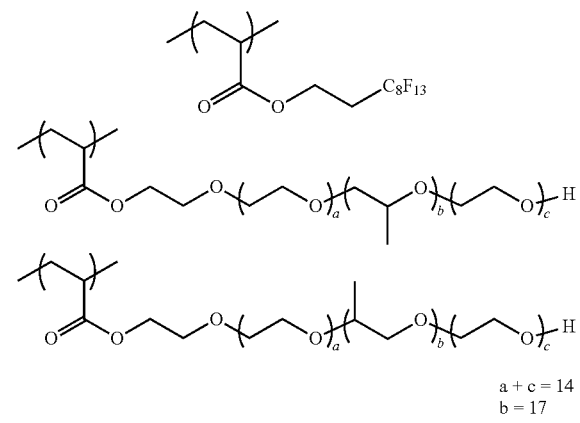

F2: KF6001 (manufactured by Shin-Etsu Chemical Co., Ltd.)

(Polymerizable Compound)

M1: KAYARAD DPHA (manufactured by Nippon Kayaku Co., Ltd.)

(Photopolymerization Initiator)

I1: IRGACURE-OXE01 (manufactured by BASF SE)

[Evaluation]

In a clean room of class 1000, the composition obtained as described above was applied to an 8-inch (=20.32 cm) silicon wafer using a spin coating method such that the thickness of the coating film after the application was 0.6 μm. Next, the applied composition was heated at 100° C. for 2 minutes and was heated at 220° C. for 5 minutes. As a result, a film was formed. The obtained film was evaluated as follows. The results are shown in Table 2 below.

<Surface Shape (in-Plane Homogeneity)>

The surface shape (in-plane homogeneity) of the obtained film was measured using a F50 automatic film thickness measurement system (manufactured by Filmetrics Japan, Inc.). The film thickness was measured at 41 points positioned at regular intervals in a diameter direction of a silicon wafer, and a difference between the maximum value and the minimum value of the film thickness was obtained. The results were divided to evaluate the surface shape.

A: the difference between the maximum value and the minimum value was less than 10 nm B: the difference between the maximum value and the minimum value was 10 nm or more and less than 15 nm C: the difference between the maximum value and the minimum value was 15 nm or more and less than 20 nm D: the difference between the maximum value and the minimum value was 20 nm or more <Refractive Index>

The refractive index of the obtained film was measured using an ellipsometer (VUW-vase (trade name), manufactured by J. A. Woollam Co., Inc.) (wavelength: 633 nm, measurement temperature: 25° C.).

<Number of Defects>

The number of defects in the obtained film was inspected using a wafer defect evaluation device ComPlus3 (manufactured by Applied Materials, Inc.), and the number of defects having a size of 0.5 μm or more was counted. In a 8-inch silicon wafer, a inner region of 5 mm or more from an outer peripheral portion was set as the inspection range.

TABLE 2

|  | Viscosity of Composition (mPa · s) | Kind of Solvent A1 | Content of Solvent A1 in Solvent (mass %) | Evaluation | | |
|---|---|---|---|---|---|---|
|  |  |  |  | Surface Shape | Refractive Index | Number of Defects |
| Example 1 | 2.2 | A1-3 | 8.9 mass % | A | 1.24 | 42 |
| Example 2 | 1.9 | A1-4 | 8.9 mass % | A | 1.24 | 45 |
| Example 3 | 1.9 | A1-5 | 8.9 mass % | A | 1.22 | 64 |
| Example 4 | 2.3 | A1-6 | 8.9 mass % | A | 1.21 | 17 |
| Example 5 | 2.2 | A1-7 | 4.4 mass % | A | 1.21 | 52 |
| Example 6 | 2.3 | A1-7 | 8.9 mass % | A | 1.21 | 26 |
| Example 7 | 2.4 | A1-7 | 13.3 mass % | B | 1.21 | 25 |
| Example 8 | 2.5 | A1-8 | 8.9 mass % | A | 1.22 | 31 |
| Example 9 | 2.2 | A1-11 | 8.9 mass % | A | 1.22 | 56 |
| Example 10 | 2.3 | A1-12 | 8.9 mass % | A | 1.21 | 44 |
| Example 11 | 3.5 | A1-13 | 8.9 mass % | A | 1.22 | 68 |
| Example 12 | 2.5 | A1-15 | 8.9 mass % | A | 1.21 | 60 |
| Example 13 | 2.4 | A1-17 | 8.9 mass % | A | 1.21 | 40 |
| Example 14 | 2.4 | A1-17 | 8.9 mass % | A | 1.21 | 80 |
| Example 15 | 2.4 | A1-6 | 9.3 mass % | A | 1.31 | 85 |
| Example 16 | 2.4 | A1-6 | 8.9 mass % | A | 1.21 | 16 |
| Example 17 | 2.4 | A1-6 | 8.9 mass % | A | 1.21 |  |
| Example 18 | 2.5 | A1-6 | 4.4 mass % | A | 1.21 | 16 |
| Example 19 | 2.3 | A1-6 | 8.9 mass % | A | 1.21 | 17 |
| Example 20 | 2.3 | A1-6 | 8.9 mass % | A | 1.21 | 19 |
| Example 21 | 2.3 | A1-6 | 8.9 mass % | A | 1.21 | 17 |
| Comparative Example 1 | 4.2 | A1-18 | 8.9 mass % | C | 1.21 | >1000 |
| Comparative Example 2 | 2.3 | — | — | C | 1.21 | >1000 |
| Comparative Example 3 | 2.3 | A1-6 | 8.9 mass % | C | 1.21 | >1000 |

As shown in the tables, in Examples, a film having reduced defects was able to be formed.

In addition, in a clean room of class 1000, the composition according to Example 15 was applied to an 8-inch (=20.32 cm) silicon wafer using a spin coating method such that the thickness of the coating film after the application was 0.6 μm. Next, the composition was heated at 100° C. for 2 minutes. Next, the composition was irradiated with i-rays at an exposure dose of 1000 mJ/cm² through a reticle with an opening having a size of 0.8 μm×0.8 μm. Next, after shifting the reticle by 1.0 μm, the composition was irradiated with i-rays again at an exposure dose of 1000 mJ/cm². Next, puddle development was performed at 23° C. for 60 seconds using a developer (aqueous solution of 2.38 mass % tetramethylammonium hydroxide), and the composition was rinsed with pure water and was spin-dried. This way, a grid structure having a width of 0.2 pin was able to be formed.

In a case where each of partition walls 40 to 43 shown in FIG. 1 of JP2017-028241A was formed using the composition according to Examples to form an image sensor shown in FIG. 1 of JP2017-028241A, this image sensor had excellent sensitivity.

What is claimed is:

1. A composition comprising:
   colloidal silica particles; and
   a solvent,
   wherein in the colloidal silica particles, a plurality of spherical silica particles having an average particle size of 1 to 80 nm are linked in a beaded shape,
   the solvent includes a solvent A1 having a boiling point of 190° C. to 280° C. and a solvent A2 having a boiling point of 110° C. or higher and lower than 190° C.,
   a content of the colloidal silica particles with respect to a total solid content of the composition is 95 mass % or higher,
   the solvent includes 3 mass % or higher to 12 mass % or lower of the solvent A1,
   a content of the solvent A2 is 750 to 5000 parts by mass with respect to 100 parts by mass of the solvent A1,
   a total content of the solvent A1 and the solvent A2 in the solvent is 82 mass % or higher, and
   a viscosity of the composition at 25° C. is 4 mPa·s or lower.

2. A composition comprising:
   colloidal silica particles; and
   a solvent,
   wherein in the colloidal silica particles, a plurality of spherical silica particles having an average particle size of 1 to 80 nm are linked in a planar shape,
   the solvent includes a solvent A1 having a boiling point of 190° C. to 280° C. and a solvent A2 having a boiling point of 110° C. or higher and lower than 190° C.,
   a content of the colloidal silica particles with respect to a total solid content of the composition is 95 mass % or higher,
   the solvent includes 3 mass % or higher to 12 mass % or lower of the solvent A1,
   a content of the solvent A2 is 750 to 5000 parts by mass with respect to 100 parts by mass of the solvent A1,
   a total content of the solvent A1 and the solvent A2 in the solvent is 82 mass % or higher, and
   a viscosity of the composition at 25° C. is 4 mPa·s or lower.

3. The composition according to claim 1,
   wherein the solvent A1 is a non-protonic solvent.

4. The composition according to claim 1,
   wherein the solvent A1 includes at least one selected from alkylenediol diacetate or cyclic carbonate.

5. The composition according to claim 1,
   wherein the solvent A2 includes at least one selected from an ether solvent or an ester solvent.

6. The composition according to claim 1,
   wherein the solvent further includes at least one solvent A3 selected from methanol, ethanol, or 2-propyl alcohol.

7. The composition according to claim 1,
   wherein a content of a compound having a molecular weight of higher than 300 in the solvent is 10 mass % or lower.

8. The composition according to claim 1,
   wherein a content of a compound having a viscosity of higher than 10 mPa·s at 25° C. in the solvent is 10 mass % or lower.

9. The composition according to claim 1,
   wherein a concentration of solid contents of the composition is 5 mass % or higher.

10. The composition according to claim 1,
    wherein a content of the colloidal silica particles in the composition is 5 mass % or higher.

11. The composition according to claim 1,
    wherein an absolute value of a zeta potential of the composition is 25 mV or higher.

12. The composition according to claim 1, further comprising:
    a photopolymerization initiator; and
    a polymerizable compound.

13. The composition according to claim 1, which is used for forming a pattern using a photolithography method.

14. The composition according to claim 1,
wherein in a case where the composition is applied to a glass substrate and is heated at 200° C. for 5 minutes to form a film having a thickness of 0.5 μm, a contact angle of the film with water at 25° C. is 30° or more.

15. A film forming method comprising:
applying the composition according to claim 1 to a support to form a composition layer.

16. The composition according to claim 1, wherein a content of the colloidal silica particles with respect to a total solid content of the composition is 99 mass % or higher.

17. The composition according to claim 1, wherein
the solvent further includes water and at least one solvent A3 selected from methanol, ethanol, or 2-propyl alcohol,
a content of the solvent A3 is 0.1% to 10 mass % with respect to a total content of the solvent, and
a content of water is 0.1% to 5 mass % with respect to a total content of the solvent.

* * * * *